United States Patent
Yamazaki et al.

(10) Patent No.: US 7,682,931 B2
(45) Date of Patent: Mar. 23, 2010

(54) METHOD FOR MANUFACTURING SEMICONDUCTOR DEVICE

(75) Inventors: Shunpei Yamazaki, Setagaya (JP); Ikuko Kawamata, Atsugi (JP); Yasuyuki Arai, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 0 days.

(21) Appl. No.: 12/076,147

(22) Filed: Mar. 14, 2008

(65) Prior Publication Data

US 2008/0242051 A1  Oct. 2, 2008

(30) Foreign Application Priority Data

Mar. 26, 2007  (JP) .............................. 2007-079787

(51) Int. Cl.
*H01L 21/30* (2006.01)
(52) U.S. Cl. ............................. 438/455; 257/E21.568
(58) Field of Classification Search ................. 438/455; 257/E21.568

See application file for complete search history.

(56) References Cited

U.S. PATENT DOCUMENTS

| | | | |
|---|---|---|---|
| 6,191,007 B1 | 2/2001 | Matsui et al. | |
| 6,380,019 B1 * | 4/2002 | Yu et al. | ...................... 438/221 |
| 6,380,046 B1 | 4/2002 | Yamazaki | |
| 7,199,024 B2 | 4/2007 | Yamazaki | |
| 2002/0109144 A1 | 8/2002 | Yamazaki | |
| 2007/0134891 A1 * | 6/2007 | Adetutu et al. | .............. 438/464 |
| 2007/0173000 A1 | 7/2007 | Yamazaki | |

FOREIGN PATENT DOCUMENTS

| | | |
|---|---|---|
| JP | 11-045862 | 2/1999 |
| JP | 2000-012864 | 1/2000 |

* cited by examiner

*Primary Examiner*—Trung Dang
(74) *Attorney, Agent, or Firm*—Eric J. Robinson; Robinson Intellectual Property Law Office, P.C.

(57) ABSTRACT

When single crystal semiconductor layers are transposed from a single crystal semiconductor substrate (a bond wafer), the single crystal semiconductor substrate is etched selectively (this step is also referred to as groove processing), and a plurality of single crystal semiconductor layers, which are being divided in size of manufactured semiconductor elements, are transposed to a different substrate (a base substrate). Thus, a plurality of island-shaped single crystal semiconductor layers (SOI layers) can be formed over the base substrate. Further, etching is performed on the single crystal semiconductor layers formed over the base substrate, and the shapes of the SOI layers are controlled precisely by being processed and modified.

26 Claims, 29 Drawing Sheets 215
216

215a  215b   216a  216b

A                                B

FIG. 26A
FIG. 26B
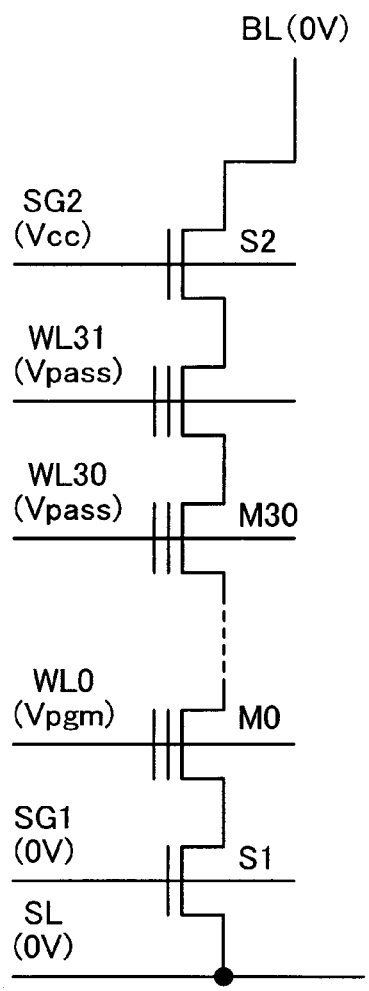
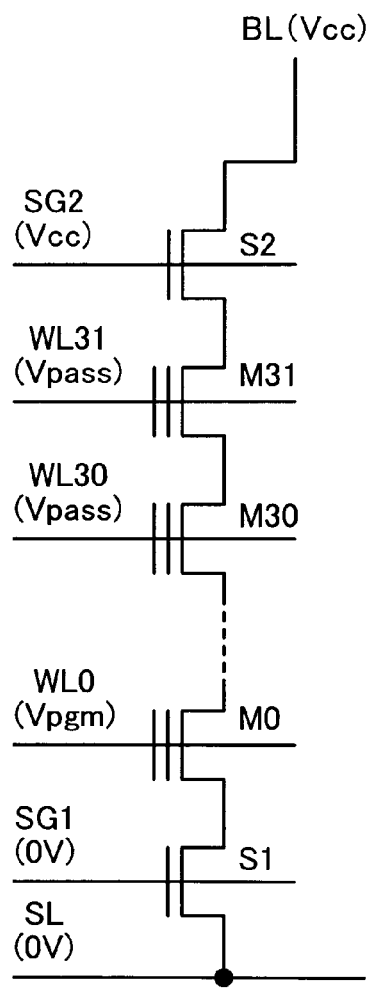

METHOD FOR MANUFACTURING SEMICONDUCTOR DEVICE

BACKGROUND OF THE INVENTION

1. Field of the Invention

The present invention relates to a method for manufacturing semiconductor devices having a so-called silicon on insulator (SOI) structure in which a semiconductor layer is provided on an insulating surface.

2. Description of the Related Art

As an alternative to a silicon wafer which is manufactured by thinly slicing an ingot of a single crystal semiconductor, an integrated circuit using a semiconductor substrate which is referred to as a silicon on an insulator (hereinafter also referred to as "SOI") substrate in which a thin single crystal semiconductor layer is provided on an insulating surface has been developed. The integrated circuit using an SOI substrate has attracted attention as an integrated circuit which reduces parasitic capacitance between a drain of a transistor and the substrate and improves the performance of a semiconductor integrated circuit.

There are various methods for manufacturing an SOI substrate. As a method in which both quality of an SOI layer and ease of production (throughput) are realized, a method for manufacturing an SOI substrate which is referred to as a Smart Cut (registered trademark) is known. To form the SOI substrate, hydrogen ions are implanted into a silicon wafer (a bond wafer), and the bond wafer is bonded to a base wafer which becomes another base. A silicon layer which is bonded to the base wafer is subjected to heat treatment at approximately 500° C., thereby being separated from the bond wafer.

As an example of a semiconductor device using such an SOI substrate, a semiconductor device disclosed by the present applicant is known (see Patent Document 1: Japanese Published Patent Application No. 2000-012864).

SUMMARY OF THE INVENTION

Thus, there has been SOI technology conventionally; however, the area of an SOI substrate has depended on the size of a silicon wafer. Thus, it has not been possible to improve throughput using a large-sized substrate. Meanwhile, there is a method for forming a crystalline silicon layer over a substrate by crystallizing an amorphous silicon layer by laser annealing or the like with the use of a film formation method; however, a single crystal silicon layer cannot be obtained and it has been difficult to perform orientational control or the like of the silicon layer.

Thus, it is an object of the present invention to manufacture a semiconductor element and an integrated circuit that have high performance over a large-sized substrate with high throughput and high productivity.

According to the present invention, when single crystal semiconductor layers are transferred from a single crystal semiconductor substrate (a bond wafer), the single crystal semiconductor substrate is etched selectively (this step is also referred to as groove processing), and a plurality of single crystal semiconductor layers divided such that they have the size of semiconductor elements to be manufactured are transferred to a different substrate (a base substrate). Thus, a plurality of island-shaped single crystal semiconductor layers (SOI layers) can be formed over the base substrate. Since the single crystal semiconductor layers which are processed into an element size in advance are transferred, transfer to the base substrate can be performed in units of the single crystal semiconductor layers; thus, the size and shape of the single crystal semiconductor substrate are not restricted. Therefore, transfer of single crystal semiconductor layers to a large-sized substrate can be performed more efficiently. Further, a manufacturing process can be simplified because an element isolation region does not have to be formed. Note that a single crystal semiconductor layer which is transferred to a base substrate is also referred to as an SOI layer, in this specification.

Further, in the present invention, etching is performed on the SOI layers formed over the base substrate, and the forms of the SOI layers are controlled precisely by processing and modifying the SOI layers. Accordingly, discrepancy in formation position and defects in shape of the SOI layer due to pattern misalignment caused by light exposure going around a resist mask, or the like during resist mask formation; position misalignment caused by a bonding step during transfer; or the like can be modified.

In this specification, a single crystal semiconductor layer transferred from a bond wafer to a base substrate (an SOI layer) is also referred to as a first single crystal semiconductor layer (a first SOI layer), and a single crystal semiconductor layer which is obtained by processing the first single crystal semiconductor layer (the first SOI layer) by etching (an SOI layer) is also referred to as a second single crystal semiconductor layer (a second SOI layer).

Thus, according to the present invention, a plurality of single crystal semiconductor layers (SOI layers) having a desired shape can be formed over a base substrate with a high yield. Accordingly, a semiconductor device, which includes a semiconductor element and an integrated circuit that have more precision and high performance, can be manufactured over a large-sized substrate with high throughput and high productivity.

Note that in the present invention, a semiconductor device refers to a device which can function by utilizing semiconductor characteristics. According to the present invention, a device, which includes a circuit having a semiconductor element (such as a transistor, a memory element, or a diode), or a semiconductor device such as a chip which includes a processor circuit can be manufactured.

One mode of a method for manufacturing a semiconductor device of the present invention includes the steps of: forming a first single crystal semiconductor layer which is divided into plural pieces by a separation layer containing hydrogen and/or a rare gas element, which is formed at a certain depth from a surface of a single crystal semiconductor substrate, and lengthwise grooves formed deeper than the separation layer in the single crystal semiconductor substrate; inwardly facing a face of the single crystal semiconductor substrate, over which the first single crystal semiconductor layer is formed, and an insulating surface of a substrate having an insulating surface, so that the first single crystal semiconductor layer is bonded to the insulating surface; separating the single crystal semiconductor substrate and the first single crystal semiconductor layer from each other by heat treatment; providing a plurality of the first single crystal semiconductor layers over the insulating surface of the substrate having an insulating surface; and selectively etching the first single crystal semiconductor layer to form a second single crystal semiconductor layer.

Another mode of a method for manufacturing a semiconductor device of the present invention includes the steps of: irradiating a single crystal semiconductor substrate with hydrogen and/or a rare gas element to form a separation layer containing hydrogen and/or the rare gas element, which is formed at a certain depth from a surface of the single crystal semiconductor substrate, and a single crystal semiconductor film over the separation layer; selectively etching the separation layer and the single crystal semiconductor film to form a first single crystal semiconductor layer, which is divided into plural pieces by the separation layers and the lengthwise grooves formed deeper than the separation layers in the single crystal semiconductor substrate; inwardly facing a face of the single crystal semiconductor substrate, over which the first single crystal semiconductor layer is formed, and an insulating surface of a substrate having an insulating surface, so that the first single crystal semiconductor layer is bonded to the insulating surface; separating the single crystal semiconductor substrate and the first single crystal semiconductor layer from each other by heat treatment; providing a plurality of the first single crystal semiconductor layers over the insulating surface of the substrate having an insulating surface; and selectively etching the first single crystal semiconductor layer to form a second single crystal semiconductor layer.

Another mode of a method for manufacturing a semiconductor device of the present invention includes the steps of: selectively etching a single crystal semiconductor substrate to form a lengthwise groove in the single crystal semiconductor substrate; irradiating the single crystal semiconductor substrate with hydrogen and/or a rare gas element to form a first single crystal semiconductor layer which is divided into plural pieces by a separation layer containing hydrogen and/or the rare gas element, which is formed at a certain depth from a surface of the single crystal semiconductor substrate, and lengthwise grooves formed deeper than the separation layer in the single crystal semiconductor substrate; inwardly facing a face of the single crystal semiconductor substrate, over which the first single crystal semiconductor layer is formed, and an insulating surface of a substrate having an insulating surface, so that the first single crystal semiconductor layer is bonded to the insulating surface; separating the single crystal semiconductor substrate and the first single crystal semiconductor layer from each other by heat treatment; providing a plurality of the first single crystal semiconductor layers over the insulating surface of the substrate having an insulating surface; and selectively etching the first single crystal semiconductor layer to form a second single crystal semiconductor layer.

Another mode of a method for manufacturing a semiconductor device of the present invention includes the steps of: forming a silicon oxide film and a silicon nitride film over a single crystal semiconductor substrate; irradiating the single crystal semiconductor substrate with hydrogen and/or a rare gas element, through the silicon oxide film and the silicon nitride film, to form an separation layer containing hydrogen and/or the rare gas element, which is formed at a certain depth from a surface of the single crystal semiconductor substrate, and a single crystal semiconductor film over the separation layer; selectively etching the silicon oxide film and the silicon nitride film to form a silicon oxide layer and a silicon nitride layer; selectively etching the separation layer and the single crystal semiconductor film with the use of the silicon nitride layer as a mask to form a first single crystal semiconductor layer which is divided into plural pieces by the separation layers and lengthwise grooves formed deeper than the separation layer in the single crystal semiconductor substrate; removing the silicon nitride layer; inwardly facing a face of the single crystal semiconductor substrate, over which the first single crystal semiconductor layer and the silicon oxide layer are formed, and an insulating surface of a substrate having an insulating surface, so that the first single crystal semiconductor layer is bonded to the insulating surface with the silicon oxide layer interposed therebetween; separating the single crystal semiconductor substrate from the first single crystal semiconductor layer and the silicon oxide layer by heat treatment; providing a plurality of the first single crystal semiconductor layers over the insulating surface of the substrate having an insulating surface with the silicon oxide layer interposed therebetween; and selectively etching the first single crystal semiconductor layer and forming a second single crystal semiconductor layer.

Another mode of a method for manufacturing a semiconductor device of the present invention includes the steps of: forming a silicon oxide film and a silicon nitride film over a single crystal semiconductor substrate; selectively etching the silicon oxide film and the silicon nitride film to form a silicon oxide layer and a silicon nitride layer; selectively etching the single crystal semiconductor substrate with the use of the silicon nitride layer as a mask to form a lengthwise groove in the single crystal semiconductor substrate; irradiating the single crystal semiconductor substrate with hydrogen and/or a rare gas element, through the silicon oxide layer and the silicon nitride layer, to form a first single crystal semiconductor layer which is divided into plural pieces by separation layers containing hydrogen and/or the rare gas element, which are formed at a certain depth from a surface of the single crystal semiconductor substrate, and the lengthwise grooves formed deeper than the separation layer in the single crystal semiconductor substrate; inwardly facing a face of the single crystal semiconductor substrate, over which the first single crystal semiconductor layer and the silicon oxide layer are formed, and an insulating surface of a substrate having an insulating surface, so that the first single crystal semiconductor layer is bonded to the insulating surface with the silicon oxide layer interposed therebetween; separating the single crystal semiconductor substrate from the first single crystal semiconductor layer and the silicon oxide layer by heat treatment; providing a plurality of the first single crystal semiconductor layers over the insulating surface of the substrate having an insulating surface with the silicon oxide layer interposed therebetween; and selectively etching the first single crystal semiconductor layer to form a second single crystal semiconductor layer.

In the above structures, single crystal semiconductor layers formed over a base substrate which is a substrate having an insulating surface can be transferred from a plurality of single crystal semiconductor substrates, and island-shaped single crystal semiconductor layers of various sizes and shapes can be formed corresponding to desired semiconductor elements.

With the use of single crystal semiconductor layers which are transferred to a base substrate and shapes of which are precisely further controlled by etching, various semiconductor elements, memory elements, integrated circuits, and the like that have more precision and high performance can be manufactured.

Therefore, according to the present invention, a plurality of single crystal semiconductor layers (SOI layers) each having a desired shape can be formed over a base substrate with a high yield. Thus, a semiconductor device, which includes a semiconductor element and an integrated circuit that have more precision and high performance, can be manufactured over a large-sized substrate with high throughput and high productivity.

BRIEF DESCRIPTION OF THE DRAWINGS

In the accompanying drawings:

FIGS. 26A and 26B are diagrams illustrating writing operations of a semiconductor device;

DETAILED DESCRIPTION OF THE INVENTION

Figure 1A:
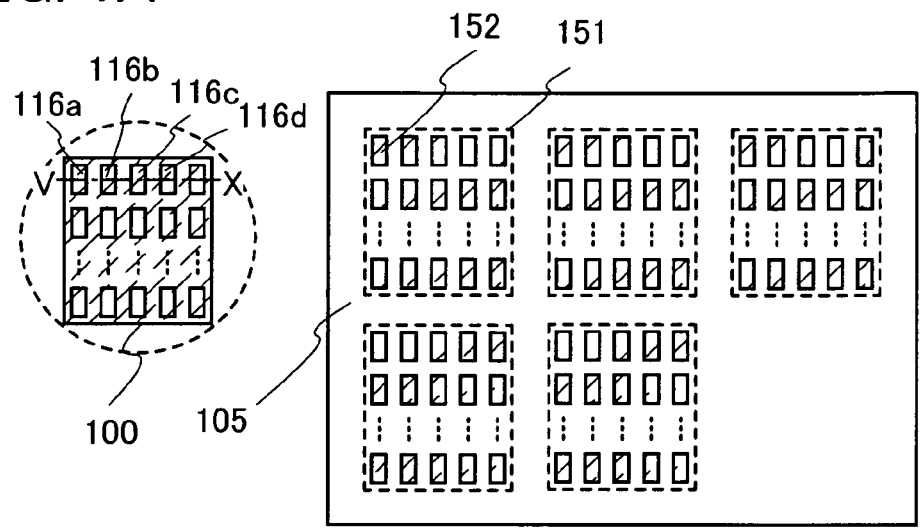
FIGS. 1A to 1C are views illustrating a method for manufacturing a semiconductor device of the present invention.

Embodiment modes of the present invention will be described hereinafter with reference to the drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiment modes below. Note that in structures of the present invention to be described below, the same portions or portions having the same function are denoted by the same reference numerals in different drawings and repetitive description thereof will be omitted.

Embodiment Mode 1

In this embodiment mode, a method for manufacturing a semiconductor device which aims to manufacture a semiconductor element (such as a metal insulator semiconductor (MIS) type electric field effect transistor (hereinafter also referred to as a "MISFET")) and an integrated circuit that have high performance over a large-sized substrate with high throughput and high productivity will be described with reference to FIGS. 1A to 3D and FIGS. 5A to 5C. Specifically, a mode in which a semiconductor layer which forms a semiconductor element is transferred from a single crystal semiconductor substrate (hereinafter also referred to as a "bond wafer") to a different substrate (hereinafter also referred to as a "base substrate") will be described.

In this embodiment mode according to the present invention, when single crystal semiconductor layers are transferred from a single crystal semiconductor substrate (a bond wafer), the single crystal semiconductor substrate is etched selectively (this step is also referred to as groove processing), and a plurality of single crystal semiconductor layers divided such that they have the size of semiconductor elements to be manufactured are transferred to a different substrate (a base substrate). Thus, a plurality of island-shaped single crystal semiconductor layers (SOI layers) can be formed over the base substrate. Since the single crystal semiconductor layers which are processed into an element size in advance are transferred, transfer to the base substrate can be performed in units of the single crystal semiconductor layers; thus, the size and shape of the single crystal semiconductor substrate are not restricted. Therefore, transfer of single crystal semiconductor layers to a large-sized base substrate can be performed more efficiently. Further, a manufacturing process can be simplified because an element isolation region does not have to be formed.

Further, in the present invention, etching is performed on the SOI layers formed over the base substrate, and the forms of the SOI layers are controlled precisely by processing and modifying the SOI layers. Accordingly, discrepancy in formation position and defects in shape of the SOI layer due to pattern misalignment caused by light exposure going around a resist mask, or the like during resist mask formation; position misalignment caused by a bonding step during transfer; or the like can be modified.

Thus, a plurality of single crystal semiconductor layers (SOI layers) having a desired shape can be formed over a base substrate with a high yield. Accordingly, a semiconductor device, which includes a semiconductor element and an integrated circuit that have more precision and high performance, can be manufactured over a large-sized substrate with high throughput and high productivity.

Figure 2A:
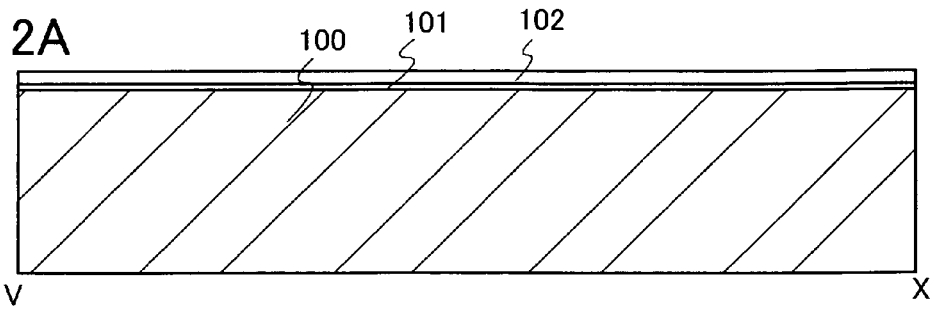
FIGS. 2A to 2E are views illustrating a method for manufacturing a semiconductor device of the present invention.

FIG. 2A illustrates a case in which a silicon oxide film 101 and a silicon nitride film 102 are formed over a bond wafer 100. It is necessary to irradiate the bond wafer 100 with hydrogen ions under a high dose condition in order to take out the single crystal semiconductor layers from the bond wafer 100. Consequently, there is a problem in that a surface of the bond wafer 100 becomes rough and bonding cannot be successfully realized in a subsequent bonding step. Thus, it is preferable to provide the silicon oxide film 101 to protect the surface of the bond wafer 100. The silicon oxide film 101 is preferably formed by thermal oxidation. For example, thermal treatment at a temperature of 900 to 1100 C.° under a water vapor atmosphere may be performed. As an alternative manufacturing method, the silicon oxide film 101 may be formed by oxidizing silicon by oxygen plasma treatment. Alternatively, as the silicon oxide film 101, a surface of a silicon oxide film, which is deposited by a vapor phase growth method, may be densified by oxygen plasma treatment.

The silicon nitride film 102 is formed over the silicon oxide film 101. The silicon nitride film 102 may be formed using silane and ammonia, which is deposited by a vapor phase growth method.

Figure 2B:
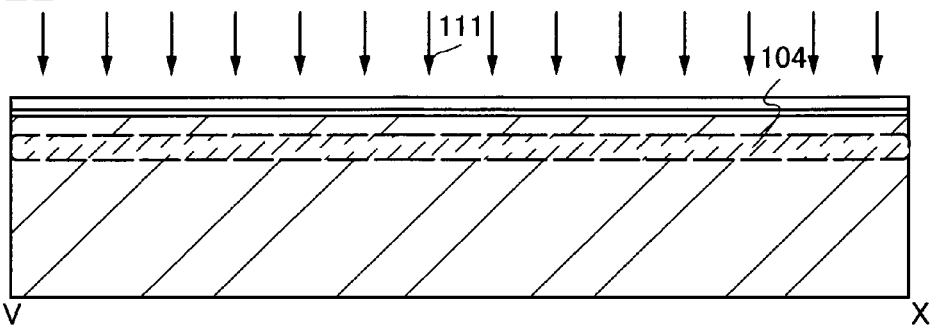
Figure 2C:
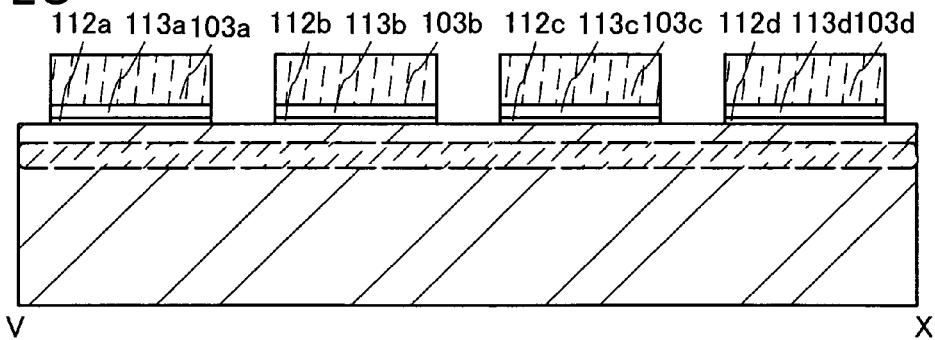

Next, irradiation of the bond wafer 100 with ions 111 of hydrogen or a rare gas element, or hydrogen and a rare gas element are performed, and a separation layer 104 which is an ion implantation layer is formed on an entire surface of the bond wafer 100 (see FIG. 2B).

In the present invention, an ion implantation layer is a region which is made fragile so as to have microcavities by ions with which a single crystal semiconductor substrate is irradiated, and hereinafter referred to as a "separation layer." This separation layer is separated by subsequent heat treatment, so that a single crystal semiconductor layer can be separated from the single crystal semiconductor substrate.

The separation layer may be formed in a single crystal semiconductor substrate by irradiation of ions by an ion doping method or an ion implantation method.

The ion doping method is a method in which, without mass separation, an ionized gas is accelerated by an electric field and a single crystal semiconductor substrate is irradiated with the accelerated gas. The ion doping method may be carried out with an ion doping apparatus.

Further, the ion implantation method is a method in which an ionized gas is mass-separated with an ion implantation apparatus and a single crystal semiconductor substrate is irradiated with the gas. With the use of the ion implantation method, an ionized hydrogen gas can be mass-separated and selectively accelerated to perform irradiation.

Hydrogen ion irradiation is performed taking a thickness of single crystal semiconductor layers which are transferred to a base substrate into consideration. The thickness of the single crystal semiconductor layers is 10 to 200 nm, preferably, 10 to 50 nm. An accelerating voltage for irradiation of the bond wafer 100 with hydrogen ions is determined taking such a thickness into consideration, so that the bond wafer 100 is irradiated deep with the ions. The separation layer 104 is formed by this treatment in a region of the bond wafer 100 which is at a certain depth from the surface of the bond wafer 100. As the separation layer 104, not only hydrogen but also a rare gas element may be used, or a mixture of both these gases may be used.

The silicon nitride film 102 is used as a hard mask in performing groove processing on the bond wafer 100. The groove processing is performed taking the shape of semiconductor layers of a semiconductor element into consideration. That is, the groove processing is performed on the bond wafer 100 such that semiconductor layers of a semiconductor element can be transferred to a base substrate and portions of the semiconductor layers remain as convex portions.

Masks 103a, 103b, 103c, and 103d are formed with a photoresist. The silicon oxide film 101 and the silicon nitride film 102 are etched using the masks 103a, 103b, 103c, and 103d, and silicon oxide layers 112a, 112b, 112c, and 112d and silicon nitride layers 113a, 113b, 113c, and 113d are formed (see FIG. 2C).

Figure 2D:
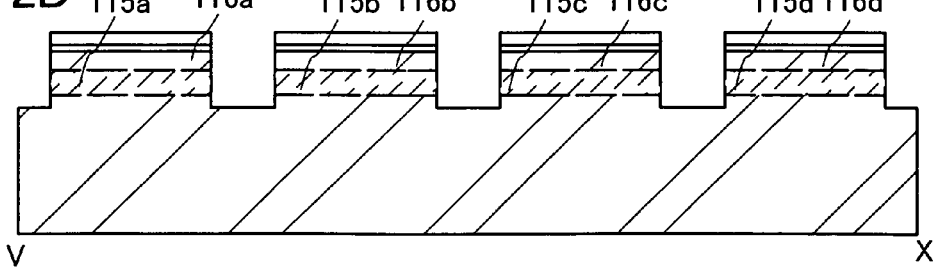

Subsequently, the bond wafer 100 is etched using the silicon nitride layers 113a, 113b, 113c, and 113d as hard masks, and a bond wafer 100 having separation layers 115a, 115b, 115c, and 115d, and single crystal semiconductor layers 116a, 116b, 116c, and 116d are formed (see FIG. 2D). In the present invention, single crystal semiconductor regions that are parts of the bond wafer which is processed into convex shapes by the separation layer and the groove processing are referred to as the single crystal semiconductor layers 116a, 116b, 116c, and 116d, as illustrated in FIG. 2D.

The depth of the bond wafer 100 where etching is performed is determined as appropriate taking into consideration a thickness of the single crystal semiconductor layers which are to be transferred to a base substrate. The thickness of the single crystal semiconductor layers can be determined according to a depth where hydrogen ions reach by irradiation. The depth of grooves which are formed in the bond wafer 100 is preferably deeper than the separation layer. In this groove processing, the depth of the grooves are processed to be deeper than the depth of the separation layer 104, so that the separation layer 104 can be left only in the regions of the single crystal semiconductor layers which is separated. In addition, although FIG. 2D illustrates an example in which the grooves are rectangular in a cross-sectional view, the shape of the grooves is not limited to a rectangle. For example, the shape of the grooves can also be rounded (have a curvature) in a cross-sectional view with the use of a wet etching method as a processing means.

Figure 2E:
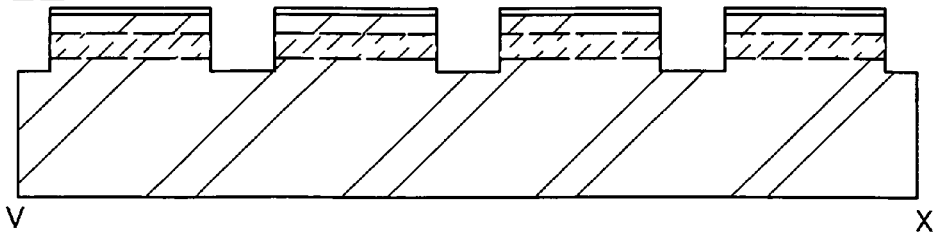

After the ion irradiation step has been performed, the surface silicon nitride layers 113a, 113b, 113c, and 113d are removed (see FIG. 2E). Then, the surfaces of the silicon oxide layers 112a, 112b, 112c, and 112d of the bond wafer 100 and a base substrate 105 are bonded (see FIG. 3A). Here, as the base substrate 105, various substrates can be applied because the bond can be formed at a low temperature. As a material of the base substrate 105, an insulating substrate such as glass, quartz, or sapphire; a semiconductor substrate such as silicon, gallium arsenide, or indium phosphorus; or the like can be applied.

A silicon nitride film 106 and a silicon oxide film 107 are formed on the surface of the base substrate 105. The silicon nitride film 106 is provided so that the single crystal semiconductor layers are not contaminated by diffusion of impurities such as sodium ions from the base substrate 105. For this purpose, a silicon nitride oxide film (which means a film that contains more nitrogen than oxygen and, in the case where measurements are performed using Rutherford backscattering spectrometry (RBS) and hydrogen forward scattering (HFS), includes oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively), an aluminum nitride film, an aluminum nitride oxide film, or the like can be applied. However, in a case where there is no concern that diffusion of impurities may cause adverse effects on the single crystal semiconductor layers from the base substrate 105, the silicon nitride film 106 can also be omitted.

On the other hand, the silicon oxide film 107 is provided to form a bond with the silicon oxide film 101. In this case, instead of the silicon oxide film, a silicon oxynitride film (which means a film that contains more oxygen than nitrogen and, in the case where measurements are performed using RBS and HFS, includes oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively) can be applied. Note that percentages of nitrogen, oxygen, silicon, and hydrogen fall within the ranges given above, where the total number of atoms contained in the silicon oxynitride film or the silicon nitride oxide film is defined as 100 atomic %.

The silicon oxide layers 112a, 112b, 112c, and 112d on the side of the bond wafer 100, a surface of which is cleaned, are disposed in close contact with the silicon oxide film 107 on the side of the base substrate 105 to form the bond. The bond can be formed at room temperature. This bond is performed at an atomic level and a firm bond is formed at room temperature by van der Waals force taking effect. Since groove processing is performed on the bond wafer 100, the convex portions which form the single crystal semiconductor layers come in contact with the base substrate 105.

Figure 3A:
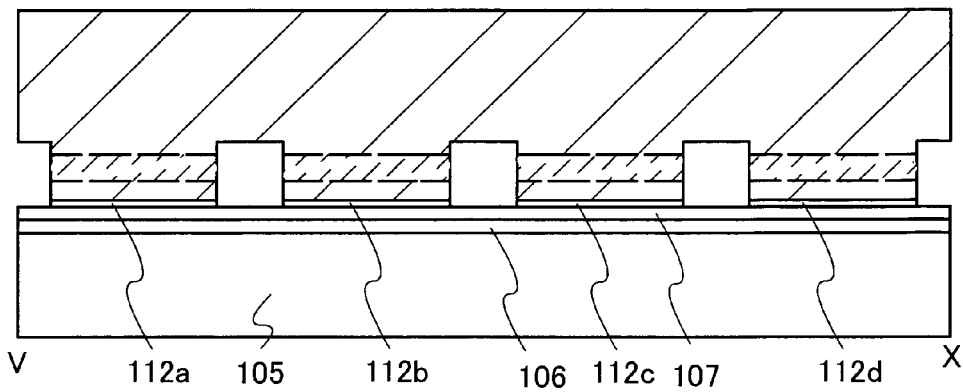
FIGS. 3A to 3D are views illustrating a method for manufacturing a semiconductor device of the present invention.
Figure 3B:
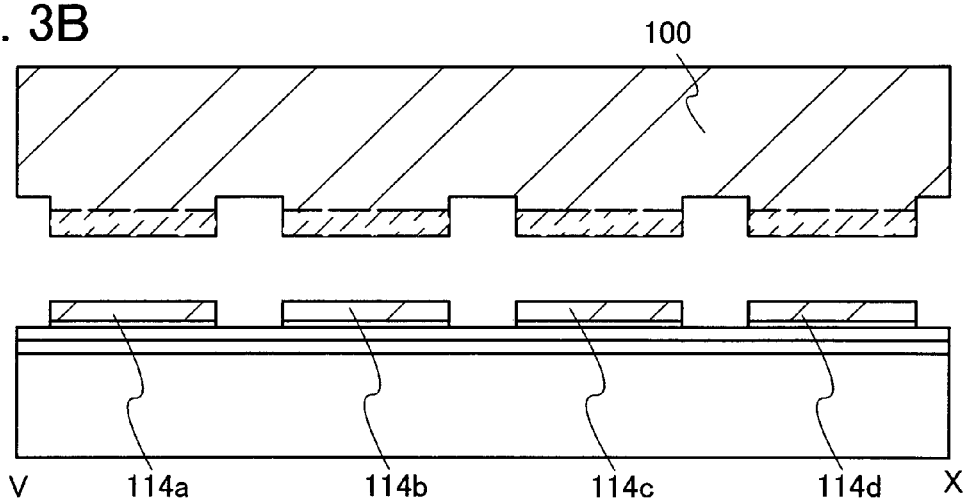
Figure 3C:
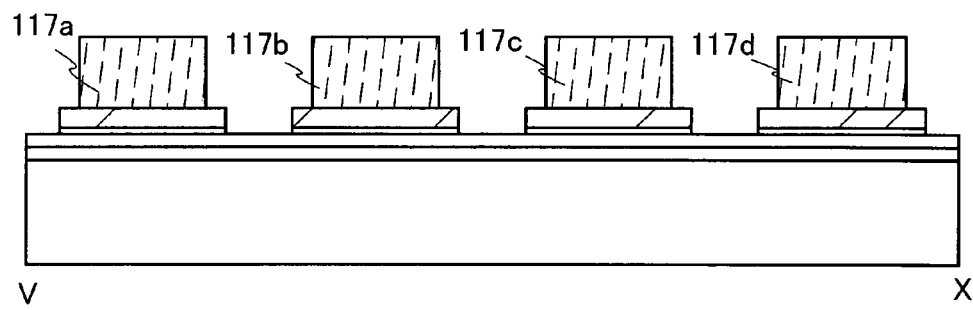

After a bond is formed between the bond wafer 100 and the base substrate 105, the single crystal semiconductor layers 116a, 116b, 116c, and 116d can be separated from the bond wafer 100 and fixed to the base substrate 105 by performing thermal treatment, as illustrated in FIG. 3B. The separation of the single crystal semiconductor layers is performed by generating a broken-out section along the separation layer 104 by causing a change in volume of fine microcavities which are formed in the separation layer 104. After that, in order to create a firmer bond, it is preferable to perform heat treatment at a temperature of 400 to 600° C. In this manner, single crystal semiconductor layers (hereinafter also referred to as "SOI layers") are formed on an insulating surface. FIG. 3B illustrates SOI layers 114a, 114b, 114c, and 114d bonded to the base substrate 105.

A step of transposing the single crystal semiconductor layers 116a, 116b, 116c, and 116d from the bond wafer 100 to the base substrate 105 is described with reference to FIGS. 1A to 1C. The single crystal semiconductor layers 116a, 116b, 116c, and 116d are formed on the bond wafer 100 which has been cut from a circular (a dotted line portion in FIG. 1A) bond wafer in FIG. 1A. Note that cross-sectional views taken along line V-X of FIGS. 1A to 1C correspond to FIGS. 2A to 3D.

Figure 1B:
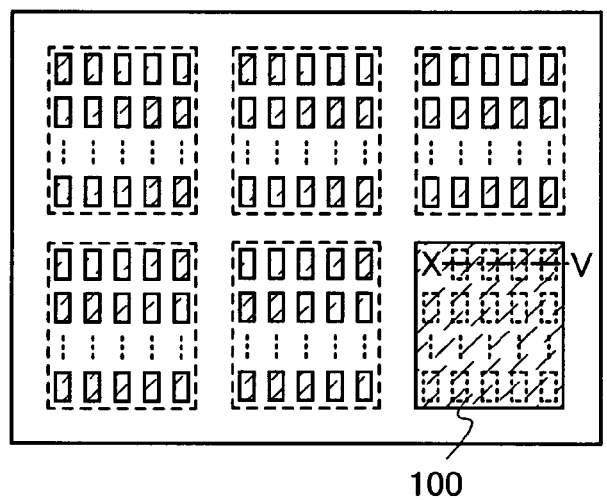
Figure 1C:
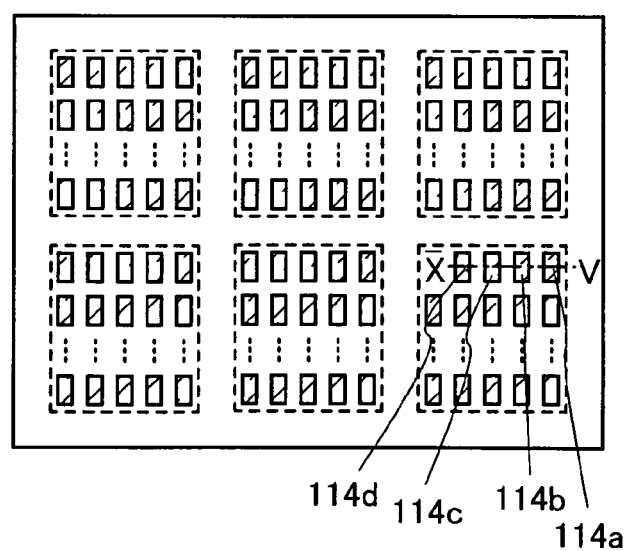

The base substrate 105 is a large-sized substrate, and a plurality of SOI layers 152 are transferred from each of other plurality of bond wafers 151 (see FIG. 1A). As in FIG. 1B, the bond wafer 100 is bonded such that the single crystal semiconductor layers 116a, 116b, 116c, and 116d are bonded to the base substrate. A bond is formed between the bond wafer 100 and the base substrate 105. After that, the SOI layers 114a, 114b, 114c, 114d can be formed as illustrated in FIG. 1C by separating the single crystal semiconductor layers 116a, 116b, 116c, and 116d from the bond wafer 100 and fixing them to the base substrate 105 by performing thermal treatment.

Since single crystal semiconductor layers are transferred in advance after being processed into those of an element size in the present invention, the transfer to the base substrate can be performed in units of single crystal semiconductor layers; thus, there is no restriction on the size or shape of a single crystal semiconductor substrate. Thus, single crystal semiconductor layers having various shapes can be formed over a bond wafer. For example, single crystal semiconductor layers can be freely formed in every mask of a light-exposure apparatus at the time of etching, in every stepper of the light-exposure apparatus for forming the mask patterns, and in every panel or chip size of a semiconductor device which is cut from a large-sized substrate.

Figure 5A:
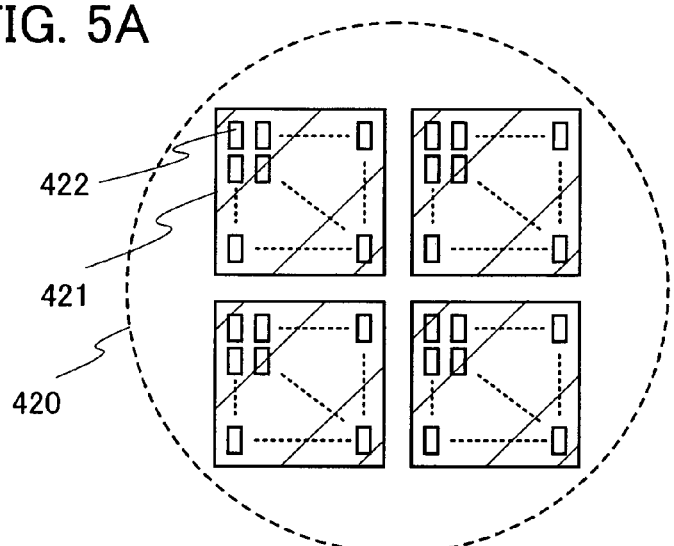
FIGS. 5A to 5C are views illustrating a method for manufacturing a semiconductor device of the present invention.
Figure 5B:
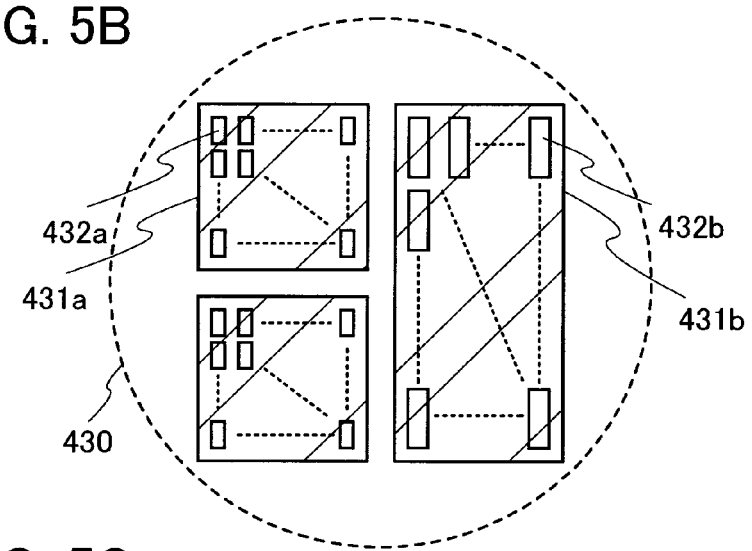
Figure 5C:
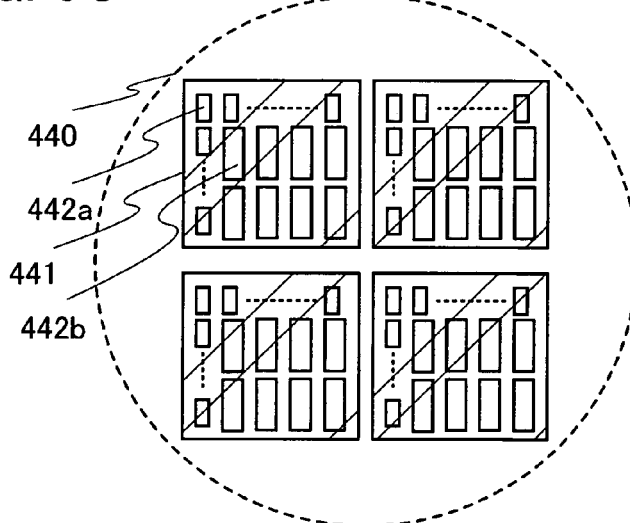

A manufacturing example of a plurality of single crystal semiconductor layers in a bond wafer is described with reference to FIGS. 5A to 5C. In FIG. 5A, a circular bond wafer 420 is divided into plural pieces of bond wafers, and a plurality of single crystal semiconductor layers 422 are formed over each of bond wafers 421. In FIG. 5B, a circular bond wafer 430 is divided into plural pieces of bond wafers which differ in size, and a plurality of single crystal semiconductor layers 432a and 432b, which differ in size, are formed over each of bond wafers 431a and 431b. In FIG. 5C, a circular bond wafer 440 is divided into bond wafers which differ in size, and a plurality of single crystal semiconductor layers 442a and 442b, which differ in size, are formed over each of bond wafers 441.

In this manner, single crystal semiconductor layers formed over a base substrate can be transferred from a plurality of single crystal semiconductor substrates, and single crystal semiconductor layers having various sizes and shapes can be formed corresponding to a desired semiconductor element. Therefore, transfer of the single crystal semiconductor layers to a large-sized base substrate can be performed more efficiently.

A crystal plane direction of the single crystal semiconductor layers can be controlled by a plane direction of a bond wafer. A bond wafer having a specific crystal plane direction may be used depending on a semiconductor element which is formed, as appropriate.

It is preferable to perform chemical mechanical polishing (CMP) on the transferred SOI layers 114a, 114b, 114c, and 114d to planarized surfaces thereof. The thickness of the SOI layers 114a, 114b, 114c, and 114d may be made much thinner by CMP, and the thickness is preferably adjusted to greater than or equal to 5 nm and less than or equal to 25 nm.

Figure 28A:
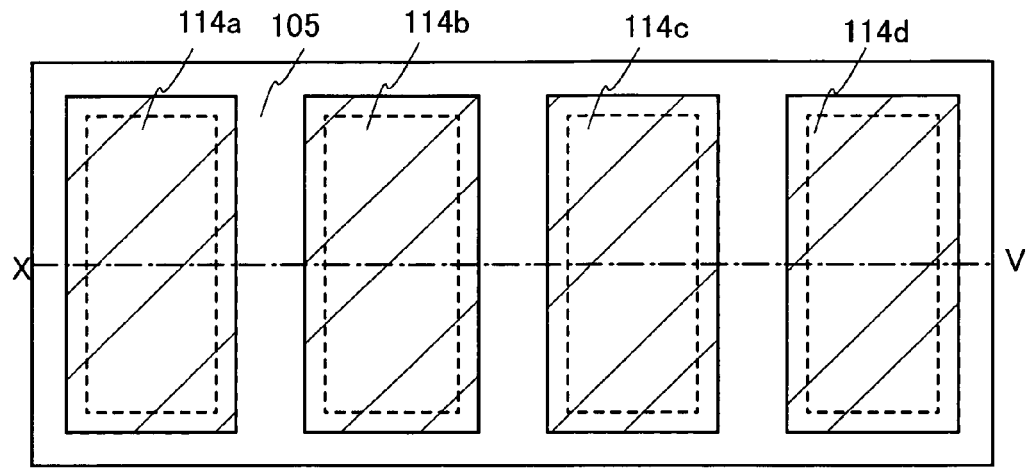
FIGS. 28A to 28C are views illustrating a method for manufacturing a semiconductor device of the present invention.
Figure 28B:
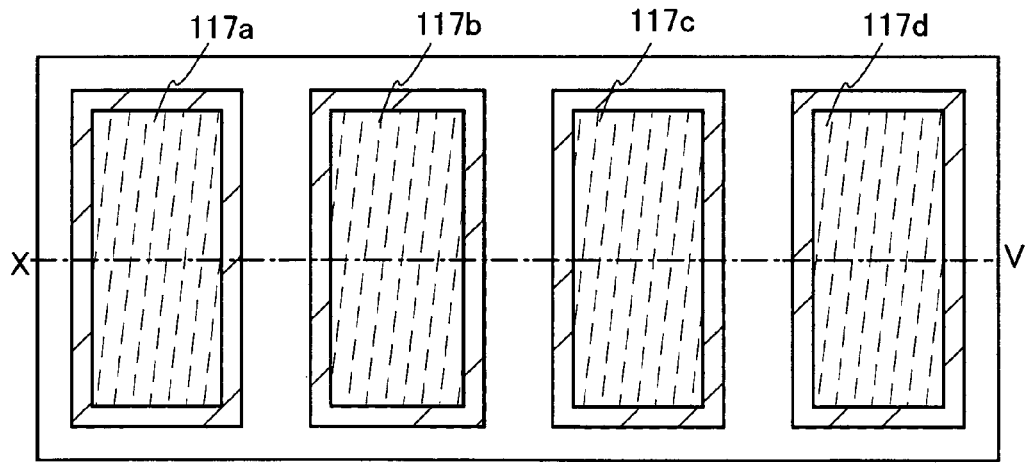
Figure 28C:
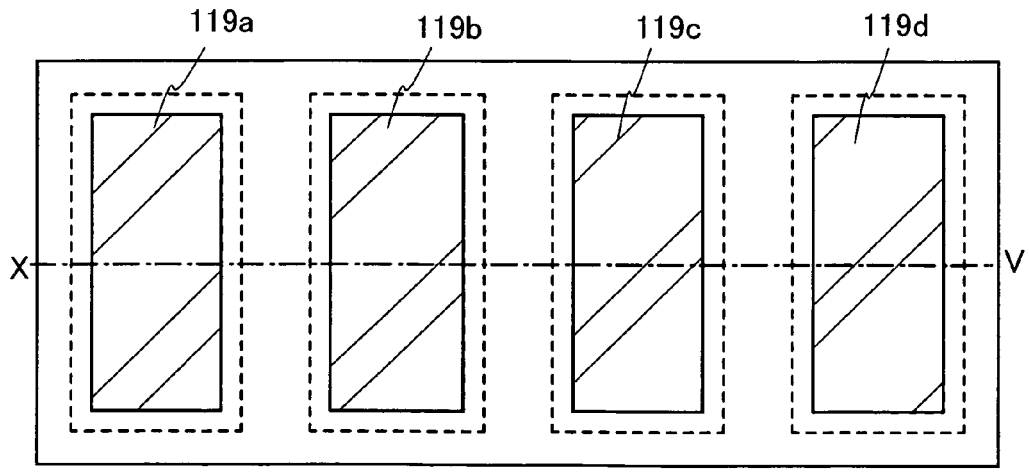

In the present invention, the transferred SOI layers 114a, 114b, 114c, and 114d are further etched and shapes thereof are processed. The process of the transferred SOI layers is described with reference to FIGS. 3C, 3D, and 28A to 28C. FIGS. 28A to 28C are plan views of FIGS. 3B to 3D, respectively. In FIGS. 28A to 28C, the base substrate 105 is schematically illustrated in order to clearly show that the SOI layers 114a, 114b, 114c, and 114d are provided over the base substrate 105. Masks 117a, 117b, 117c, and 117d are formed over the SOI layers 114a, 114b, 114c, and 114d (see FIGS. 3C and 28B). The masks 117a, 117b, 117c, and 117d are formed by exposing periphery portion which is unnecessary portions of the SOI layers 114a, 114b, 114c, and 114d.

Figure 3D:
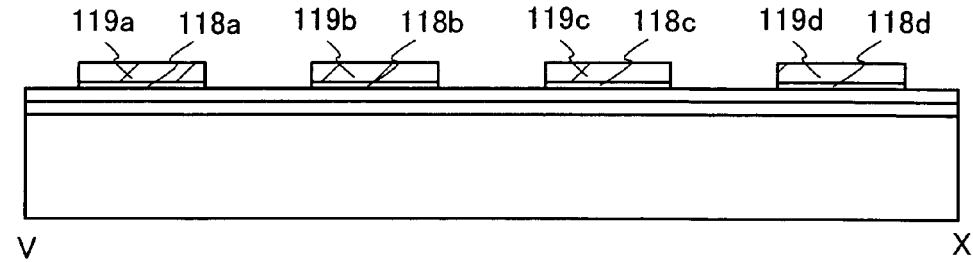

The SOI layers 114a, 114b, 114c, and 114d are etched using the masks 117a, 117b, 117c, and 117d, and SOI layers 119a, 119b, 119c, and 119d are formed. In this embodiment mode, the silicon oxide layers 112a, 112b, 112c, and 112d under the SOI layers are also etched together with the SOI layers to become silicon oxide layers 118a, 118b, 118c, and 118d (FIGS. 3D and 28C). In this manner, misalignment of a formation region, defects in shape, or the like which occurred in a manufacturing process can be modified by further processing shapes, after transfer to a base substrate.

Figure 29A:
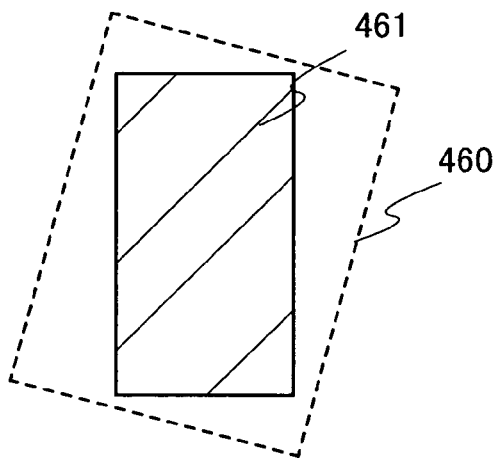
FIGS. 29A to 29C are views illustrating a method for manufacturing a semiconductor device of the present invention.
Figure 29B:
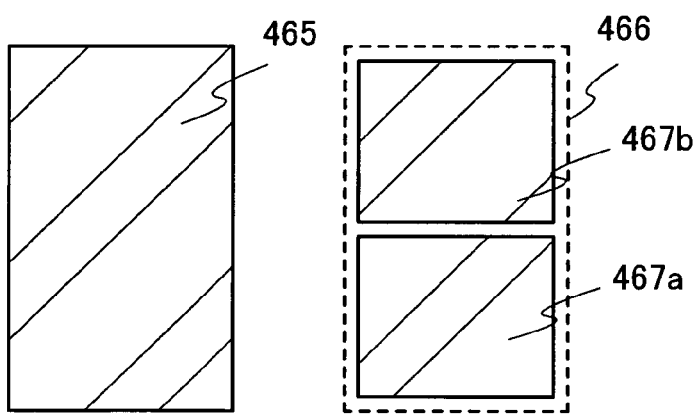
Figure 29C:
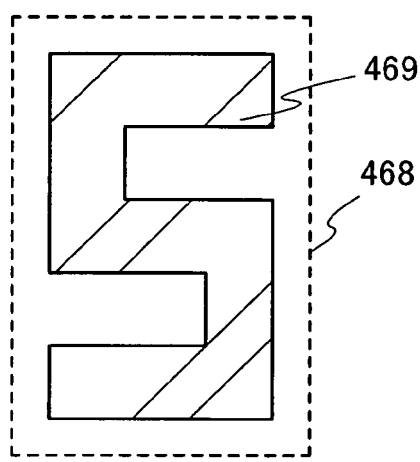

FIGS. 29A to 29C each illustrate an example of performing etching on the transferred SOI layer (the first SOI layer) to the base substrate. In FIG. 29A, the SOI layer (the first SOI layer) which is transferred from the bond wafer to the base substrate is a first SOI layer 460 denoted by a dotted line. The first SOI layer 460 is formed more inclined than a desired shape due to misalignment of a formation region which occurred in a manufacturing process such as a step of processing at a bond wafer (misalignment of light exposure at the time of mask formation, an etching defect, or the like) or a transfer step (misalignment of a bonding position). Such a first SOI layer is etched using a mask, a shape thereof is processed, and thus a second SOI layer 461 is formed.

Further, all of a plurality of first SOI layers, which are transferred, may be processed, or shapes of part of the first SOI layers may be processed selectively. As in FIG. 29B, of first SOI layers 465 and 466 which are transferred to the base substrate, the first SOI layer 465 is left as is, and the shape of the first SOI layer 466 is processed like second SOI layers 467a and 467b. Alternatively, as in FIG. 29C, a shape of a first SOI layer 468 which is transferred to the base substrate can also be processed into a complicated shape such as that of a second SOI layer 469.

In this manner, a shape of an SOI layer after being transferred is further processed, so that the shape of the SOI layer can be controlled more precisely. Thus, since an SOI layer which is controlled accurately can be obtained, the yield is improved and reliability of a semiconductor device which is obtained is also improved.

The etching of the first SOI layer may be performed similarly to the etching of the bond wafer. For example, etching may be performed using a mask which is formed by a photolithography method.

As etching processing, either plasma etching (dry etching) or wet etching may be employed. Plasma etching is suitable for processing a large-sized substrate. As an etching gas, a fluorine-based gas such as $CF_4$ or $NF_3$ or a chlorine-based gas such as $Cl_2$ or $BCl_3$ is used, and an inert gas such as He or Ar may be added as appropriate.

In addition, the masks may be formed by a method by which a pattern can be selectively formed, such as a droplet discharge method. By a droplet discharge (jetting) method (also referred to as an ink jet method depending on its system), a predetermined pattern (such as a conductive layer or an insulating layer) can be formed by selectively discharging (jetting) a droplet of a composition which is mixed for a particular purpose. At this time, treatment to control wettability or adhesion may be performed on a formation region. In addition, a method by which a pattern can be transferred or drawn, for example, a printing method (a method for forming a pattern, such as screen printing or offset printing), or the like can also be used.

As the masks, a resin material such as an epoxy resin, an acrylic resin, a phenol resin, a novolac resin, a melamine resin, or a urethane resin is used. Alternatively, an organic material such as benzocyclobutene, parylene, fluorinated arylene ether, or polyimide having a light-transmitting property; a compound material formed by polymerization of siloxane-based polymers or the like; or the like can also be used. Further alternatively, a commercially available resist material containing a photosensitizer may also be used. For example, positive type resists, negative type resists, or the like may be used. When a droplet discharge method is used with any material, the surface tension and the viscosity of a material are adjusted as appropriate by adjusting the concentration of a solvent or by adding a surfactant or the like.

In this embodiment mode, a method for separating single crystal semiconductor layers from a bond wafer by irradiating hydrogen ions to a certain depth is shown. However, it is also possible to manufacture a similar base substrate with the use of other SOI technologies. For example, a porous silicon layer is formed by anode chemical conversion on a bond wafer surface, and a single crystal silicon layer which is formed thereover by epitaxial growth can be used as the SOI layer which is shown in this embodiment mode. In the case of using the bond wafer of this structure, the porous silicon layer and the single crystal silicon layer which is formed by epitaxial growth are separated by a water jet method. Accordingly, the base substrate as illustrated in FIGS. 3A to 3D can be obtained.

Various high-performance semiconductor elements, memory elements, and integrated circuits can be manufactured using the single crystal semiconductor layers which are transferred to the base substrate.

According to this embodiment mode, a plurality of single crystal semiconductor layers (SOI layers) can be formed over a large-sized base substrate, where a semiconductor integrated circuit is formed, with high throughput and high productivity. With the use of such a base substrate, a semiconductor element and an integrated circuit that have high performance can be manufactured with high throughput and high productivity.

Embodiment Mode 2

This embodiment mode will describe a manufacturing process of a bond wafer, which differs from that of FIGS. 2A to 2E, with reference to FIGS. 4A to 4D. In this embodiment mode, a bond wafer is irradiated with ions after groove processing.

Figure 4A:
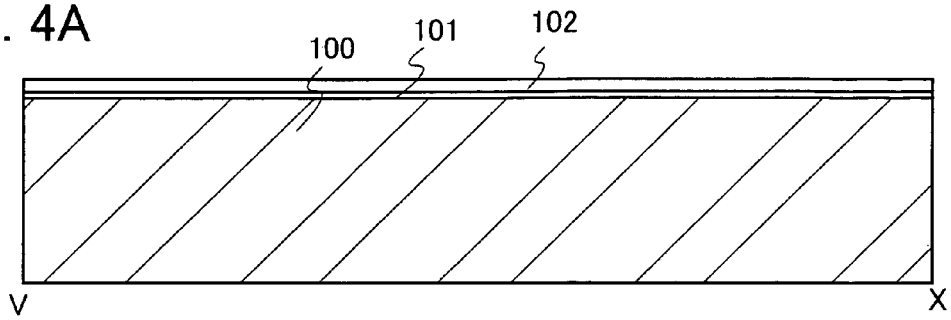
FIGS. 4A to 4D are views illustrating a method for manufacturing a semiconductor device of the present invention.
Figure 4B:
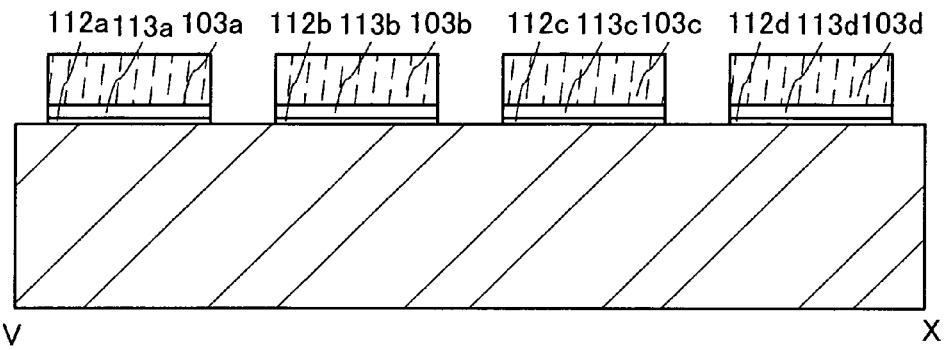

In FIG. 4A, a silicon oxide film 101 and a silicon nitride film 102 are formed on a surface of a bond wafer 100. After that, the silicon oxide film 101 and the silicon nitride film 102 are etched using masks 103a, 103b, 103c, and 103d, and silicon oxide layers 112a, 112b, 112c, and 112d and silicon nitride layers 113a, 113b, 113c, and 113d are formed (see FIG. 4B).

Figure 4C:
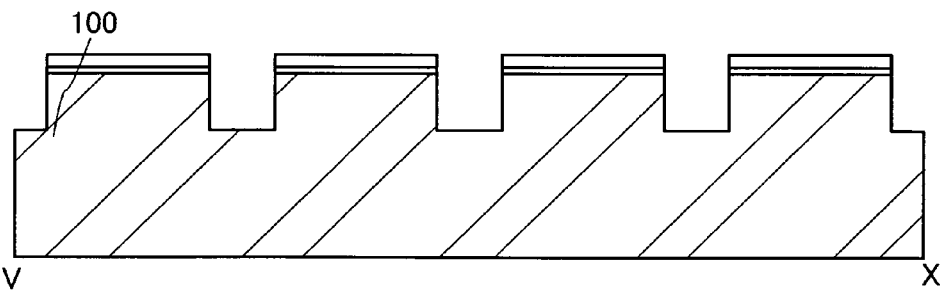

Groove processing is performed on the bond wafer 100, using the silicon nitride layers 113a, 113b, 113c, and 113d as hard masks (see FIG. 4C). The groove processing is performed such that grooves correspond to the shapes of semiconductor layers of a semiconductor element formed over a base substrate. A depth to which the bond wafer 100 is etched is determined as appropriate taking a thickness of single crystal semiconductor layers which are transferred to a base substrate in consideration. The thickness of the single crystal semiconductor layers can be determined according to a depth of single crystal semiconductor layers where hydrogen ions reach by irradiation. Grooves which are formed in the bond wafer 100 are preferably formed such that they have a depth which is deeper than the depth of separation layers.

Figure 4D:
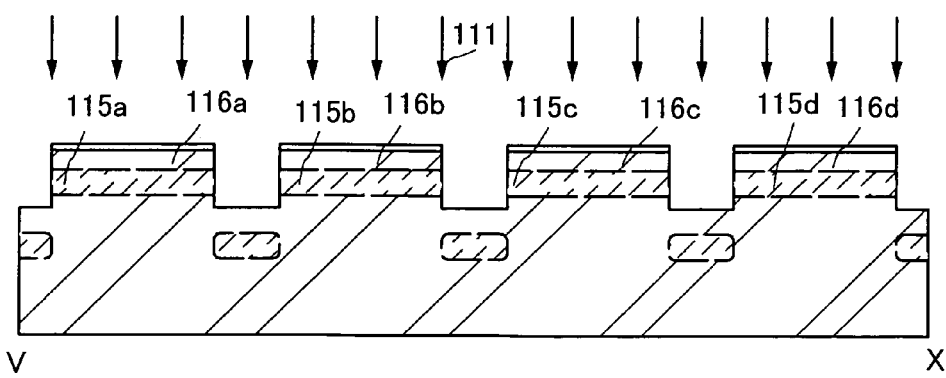

After that, irradiation of the bond wafer 100 with ions 111 of hydrogen or a rare gas element, or hydrogen and a rare gas element are performed, and separation layers 115a, 115b, 115c, and 115d are formed in a region which is at a certain depth from the surface of the bond wafer 100 (see FIG. 4D).

In this embodiment mode, when single crystal semiconductor layers are transferred from a bond wafer, a single crystal semiconductor substrate is etched selectively (this step is also referred to as groove processing), and a plurality of single crystal semiconductor layers divided such that they have the size of semiconductor elements to be manufactured are transferred to a different substrate (a base substrate). Thus, a plurality of island-shaped single crystal semiconductor layers (SOI layers) can be formed over the base substrate. Since the single crystal semiconductor layers which are processed into an element size in advance are transferred, transfer to the base substrate can be performed in units of the single crystal semiconductor layers; thus, the size and shape of the single crystal semiconductor substrate are not restricted. Therefore, transfer of single crystal semiconductor layers to a large-sized substrate can be performed more efficiently. Further, a manufacturing process can be simplified because an element isolation region does not have to be formed.

Further, in the present invention, etching is performed on the SOI layers formed over the base substrate, and the forms of the SOI layers are controlled precisely by processing and modifying the SOI layers. Accordingly, discrepancy in formation position and defects in shape of the SOI layer due to pattern misalignment caused by light exposure going around a resist mask, or the like during resist mask formation; position misalignment by a bonding step during transfer; or the like can be modified.

Thus, a plurality of single crystal semiconductor layers (SOI layers) having a desired shape can be formed over a base substrate with a high yield, according to this embodiment mode using the present invention. Accordingly, a semiconductor device, which includes a semiconductor element and an integrated circuit that have more precision and high performance, can be manufactured over a large-sized substrate with high throughput and high productivity.

Embodiment Mode 3

This embodiment mode will describe an example in which a semiconductor integrated circuit is manufactured using the base substrate manufactured in any of Embodiment Modes 1 and 2. An inverter circuit will be described below as one structural example of a complementary metal oxide semiconductor (CMOS) circuit. Note that the present invention is not limited to such a simple circuit and can realize various integrated circuits such as a microprocessor.

FIGS. 6A to 12B each illustrate one mode of a semiconductor device using the present invention. FIGS. 6A, 7A, 8A, 9A, 10A, 11A, and 12A are plan views of an inverter circuit which is a semiconductor device of this embodiment mode, and FIGS. 6B, 7B, 8B, 9B, 10B, 11B, and 12B are cross-sectional views taken along line A-B of FIGS. 6A, 7A, 8A, 9A, 10A, 11A, and 12A. Note that several kinds of insulating layers are omitted in FIGS. 6A, 7A, 8A, 9A, 10A, 11A, and 12A. Note that repetitive description of the same portions or portions having a similar function to Embodiment Mode 1 or 2 is omitted.

Figure 6A:
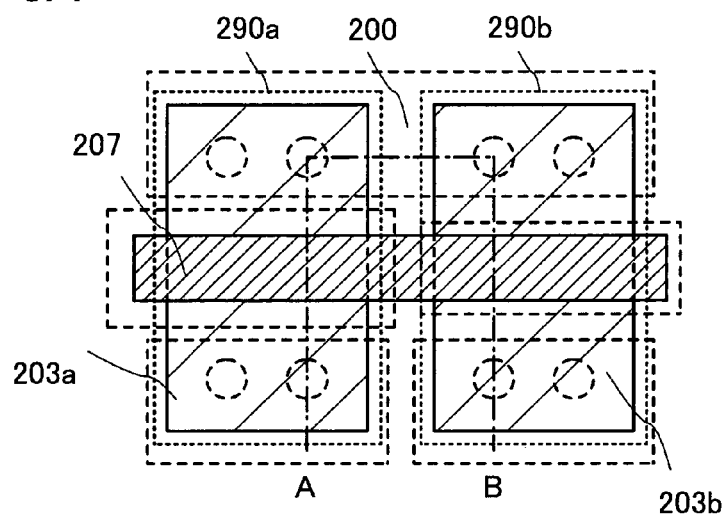
FIGS. 6A and 6B are views illustrating a method for manufacturing a semiconductor device of the present invention.
Figure 6B:
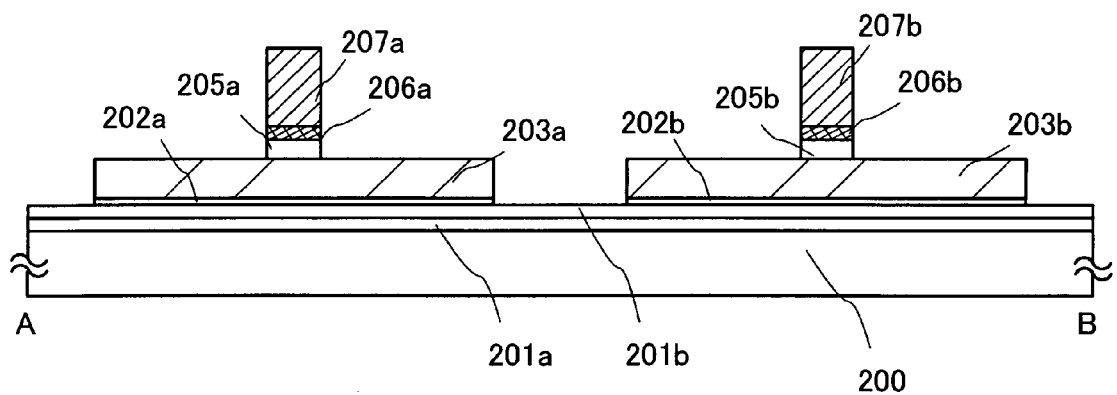

As illustrated in FIGS. 6A and 6B, a silicon nitride layer 201a (corresponding to the silicon nitride film 106 of Embodiment Mode 1) and a silicon oxide layer 201b (corresponding to the silicon oxide film 107 of Embodiment Mode 1) are provided over a base substrate 200, and SOI layers 203a and 203b which are single crystal semiconductor layers (corresponding to the SOI layers 119a to 119d of Embodiment Mode 1) are formed over the silicon nitride layer 201a and the silicon oxide layer 201b with silicon oxide layers 202a and 202b (corresponding to the silicon oxide layers 112a to 112d) interposed therebetween.

In FIG. 6A, SOI layers which are transferred from a bond wafer to the base substrate are transfer SOI layers 290a and 290b denoted by dotted lines. The transfer SOI layers 290a and 290b are formed to deviate from a desired shape due to misalignment of a formation region which occurred in a manufacturing process such as a processing step on a bond wafer (misalignment of light exposure at the time of mask formation, an etching defect, or the like) or a transfer step (misalignment of a bonding position). Such transfer SOI layers are etched using a mask, shapes thereof are processed, and thus the SOI layers 203a and 203b are formed.

In this manner, a shape of an SOI layer after being transferred is further processed, so that the shape of the SOI layer can be controlled more precisely. Thus, since an SOI layer which is controlled accurately can be obtained, the yield is improved and reliability of a semiconductor device which is obtained is also improved.

Note that this embodiment mode corresponds to Embodiment Mode 1 as described above, and a material and a manufacturing method which are similar to those of Embodiment Mode 1 may be employed.

In this embodiment mode, when single crystal semiconductor layers are transferred from a bond wafer, a single crystal semiconductor substrate is etched selectively (this step is also referred to as groove processing), and a plurality of single crystal semiconductor layers divided such that they have the size of semiconductor elements to be manufactured are transferred to a different substrate (a base substrate). Thus, a plurality of the island-shaped SOI layers 203a and 203b can be formed over the base substrate 200. Since the single crystal semiconductor layers which are processed into an element size in advance are transferred, transfer to the base substrate can be performed in units of the single crystal semiconductor layers; thus, the size and shape of the single crystal semiconductor substrate are not restricted. Therefore, transfer of single crystal semiconductor layers to a large-sized substrate can be performed more efficiently. Further, a manufacturing process can be simplified because an element isolation region does not have to be formed.

Further, in the present invention, etching is performed on the SOI layers formed over the base substrate, and the forms of the SOI layers are controlled precisely by processing and modifying the SOI layers. Accordingly, discrepancy in formation position and defects in shape of the SOI layer due to pattern misalignment caused by light exposure going around a resist mask, or the like during resist mask formation; position misalignment caused by a bonding step during transfer; or the like can be modified.

Thus, a plurality of single crystal semiconductor layers (SOI layers) having a desired shape can be formed over a base substrate with a high yield, according to this embodiment mode using the present invention. Accordingly, a semiconductor device, which includes a semiconductor element and an integrated circuit that have more precision and high performance, can be manufactured over a large-sized substrate with high throughput and high productivity.

FIGS. 6A and 6B illustrate a step of forming a gate insulating layer and a gate electrode layer over the base substrate 200 provided with the SOI layers 203a and 203b. Gate electrode layers (a first gate electrode layer 206 (206a and 206b) and a second gate electrode layer 207 (207a and 207b)) are provided over the SOI layers 203a and 203b. As gate insulating layers 205a and 205b, a material such as silicon oxide, silicon oxynitride, hafnium oxide ($HfO_x$), aluminum oxide ($Al_xO_y$)(x>y>0), or tantalum oxide ($Ta_xO_y$, x>y>0) can be applied. In FIG. 6B, the gate insulating layers 205a and 205b and the gate electrode layer (the first gate electrode layers 206 (206a and 206b) and the second gate electrode layer 207 (207a and 207b)) are processed so as to align edge portions thereof. Alternatively, in etching the gate electrode layers (the first gate electrode layer 206 (206a and 206b) and the second gate electrode layer 207 (207a and 207b)), the processing may be performed so as to leave the gate insulating layers 205a and 205b.

In addition, as the gate electrode layers (the first gate electrode layer 206 (206a and 206b) and the second gate electrode layer 207 (207a and 207b)), stacked conductive films are formed. Then, the stacked conductive films can be etched into desired tapered shapes by an inductively coupled plasma (ICP) etching method with appropriate control of the etching conditions (for example, the amount of electric energy applied to a coiled electrode layer, the amount of electric energy applied to an electrode layer on the substrate side, and the electrode temperature on the substrate side). In addition, angles and the like of the tapered shapes may also be controlled by a shape of a mask. Note that an etching gas can be selected from a chlorine-based gas typified by $Cl_2$, $BCl_3$, $SiCl_4$, or $CCl_4$; a fluorine-based gas typified by $CF_4$, $SF_6$, or $NF_3$; or $O_2$, as appropriate.

In the present invention, a conductive layer which forms a wiring layer or an electrode layer, a mask which forms a predetermined pattern, an insulating layer, and the like may be formed by a method by which a pattern can be selectively formed, such as a droplet discharge method. By a droplet discharge (jetting) method (also referred to as an ink jet method depending on its system), a predetermined pattern (such as a conductive layer or an insulating layer) can be formed by selectively discharging (jetting) a droplet of a composition which is mixed for a particular purpose. At this time, treatment to control wettability or adhesion may be performed on a formation region. In addition, a method by which a pattern can be transferred or drawn, for example, a printing method (a method for forming a pattern, such as screen printing or offset printing), or the like can also be used.

In this embodiment mode, the mask which is used is formed using a resin material such as an epoxy resin, an acrylic resin, a phenol resin, a novolac resin, a melamine resin, or a urethane resin.

In this embodiment mode, an example in which the first gate electrode layer and the second gate electrode layer are formed to have perpendicular side surfaces is shown; however, the present invention is not limited thereto. Both the first gate electrode layer and the second gate electrode layer may have tapered shapes, or only one of the gate electrode layers may have tapered shape while the other gate electrode layer may have perpendicular side surfaces by anisotropic etching. In addition, the taper angle of each stacked gate electrode layer may be either the same or different from one another. When both of the gate electrode layers or either gate electrode layer is tapered, the gate electrode layer can be tightly covered with a film which is stacked thereover. Therefore, defects can be reduced and reliability can be improved.

When a high dielectric constant substance (a high-k material) is used for the gate insulating layers 205a and 205b, the gate electrode layers (the first gate electrode layer 206 (206a and 206b) and the second gate electrode layer 207 (207a and 207b)) are formed from polycrystalline silicon, silicide, metal, or metal nitride. Metal or metal nitride is preferably used. For example, the gate electrode layers (the first gate electrode layer 206 (206a and 206b) which are in contact with the gate insulating layers 205a and 205b are formed from a metal nitride material, and the second gate electrode layer 207 (207a and 207b) thereover are formed from a metal material. By using the materials of this combination, a depletion layer can be prevented from being spread in the gate electrode layers even when the gate insulating layers are thinned; thus, loss of driving capability of a transistor can be prevented even in the case of miniaturization.

Figure 7A:
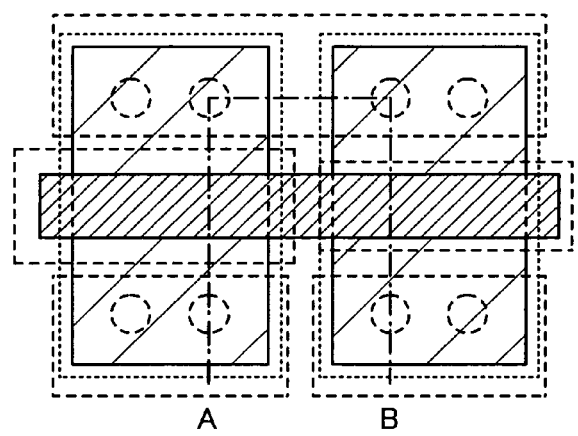
FIGS. 7A and 7B are views illustrating a method for manufacturing a semiconductor device of the present invention.
Figure 7B:
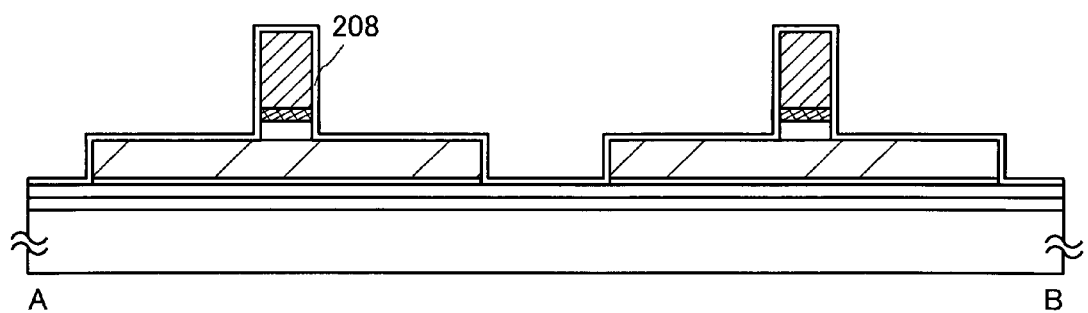

A first insulating layer 208 is formed over the SOI layers 203a and 203b, the gate electrode layers (the first gate electrode layer 206 (206a and 206b), and the second gate electrode layer 207 (207a and 207b) (see FIGS. 7A and 7B). The first insulating layer 208 is formed of a silicon oxide film or a silicon oxynitride film. As another mode, a similar layer may be formed by insulating the surfaces of the gate electrode layers (the first gate electrode layer 206 (206a and 206b) and the second gate electrode layer 207 (207a and 207b) by oxidation or nitridation treatment. The first insulating layer 208 is also made to be formed on side surfaces of the gate electrode layers (the first gate electrode layer 206 (206a and 206b) and the second gate electrode layers 207 (207a and 207b) with a thickness of 1 to 10 nm. The first insulating layer 208 is provided to form an off-set region, in which an impurity aiming at valence electron control is not added, intentionally in the SOI layers 203a and 203b in steps after the step of forming the first insulating layer 208.

Figure 8A:
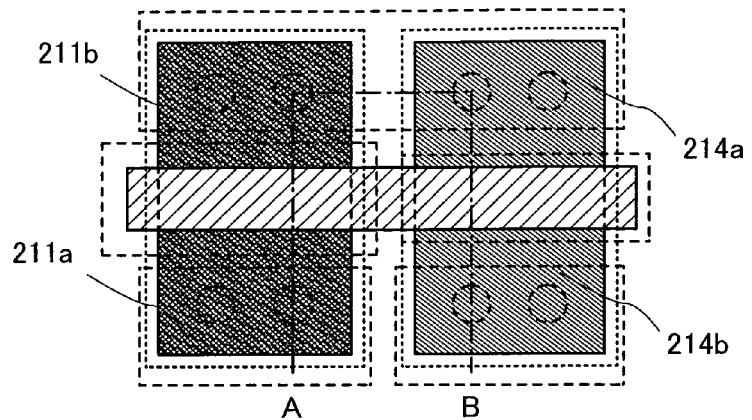
FIGS. 8A to 8C are views illustrating a method for manufacturing a semiconductor device of the present invention.
Figure 8B:
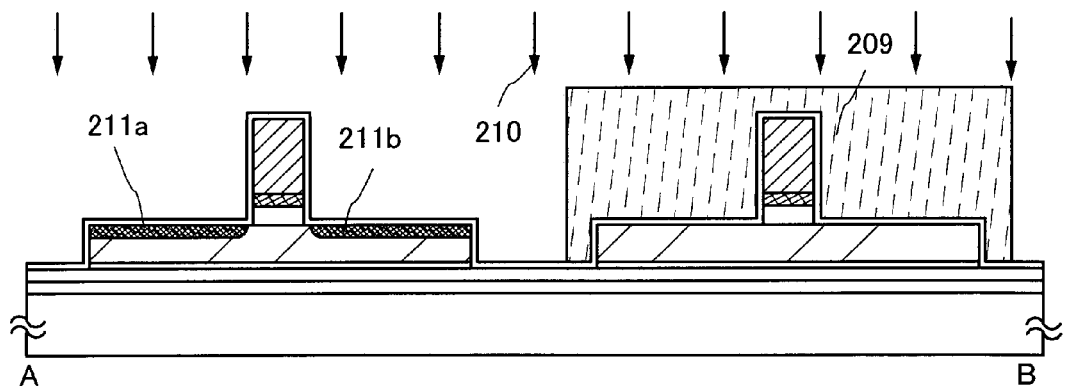
Figure 8C:
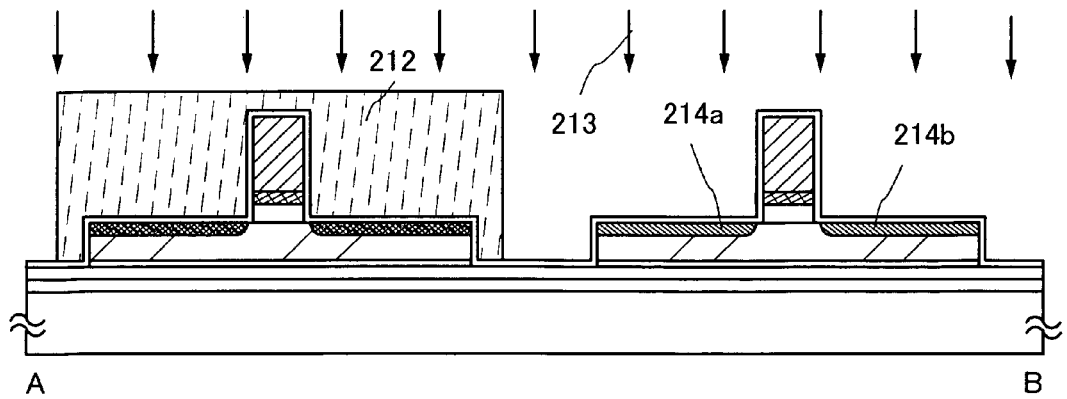

An ultra shallow bonding portion (a source-drain extension) is formed in the SOI layers 203a and 203b (see FIG. 8A). The ultra shallow bonding portion is preferably formed to suppress a short-channel effect. A mask 209 which covers the SOI layer 203b is formed; an impurity element 210 which is a Group 13 element is added to the SOI layer 203a, using the mask 209, the first gate electrode layer 206a, and the second gate electrode layer 207a as masks; and first ultra shallow bonding portions 211a and 211b are formed (see FIG. 8B). The mask 209 is removed; a mask 212 which covers the SOI layer 203a is formed; an impurity element 213 which is a Group 15 element is added to the SOI layer 203b, using the mask 212, the first gate electrode layer 206b, and the second gate electrode layer 207b as masks; and second ultra shallow bonding portions 214a and 214b are formed (see FIG. 8C).

An impurity concentration of the ultra shallow bonding portion is made to be higher than a low-concentration drain region by one digit. For example, as to the first ultra shallow bonding portions 211a and 211b, boron ion irradiation is performed at 15 keV with a dose of $3 \times 10^{13}/cm^2$, and as to the second ultra shallow bonding portions 214a and 214b, arsenic ion irradiation is performed at 15 keV with a dose of $2 \times 10^{14}/cm^2$.

Figure 9A:
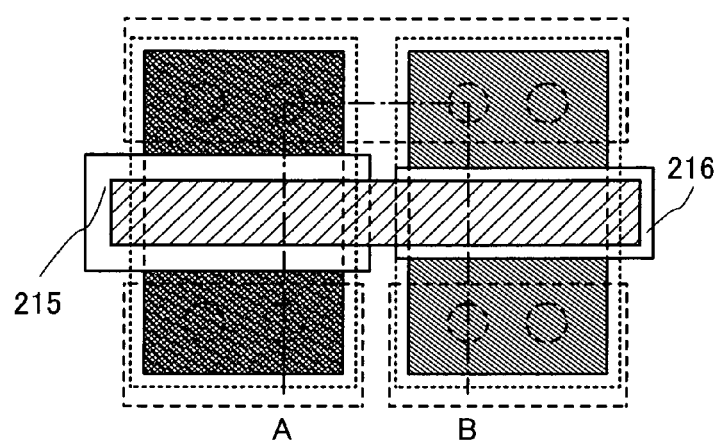
FIGS. 9A and 9B are views illustrating a method for manufacturing a semiconductor device of the present invention.
Figure 9B:
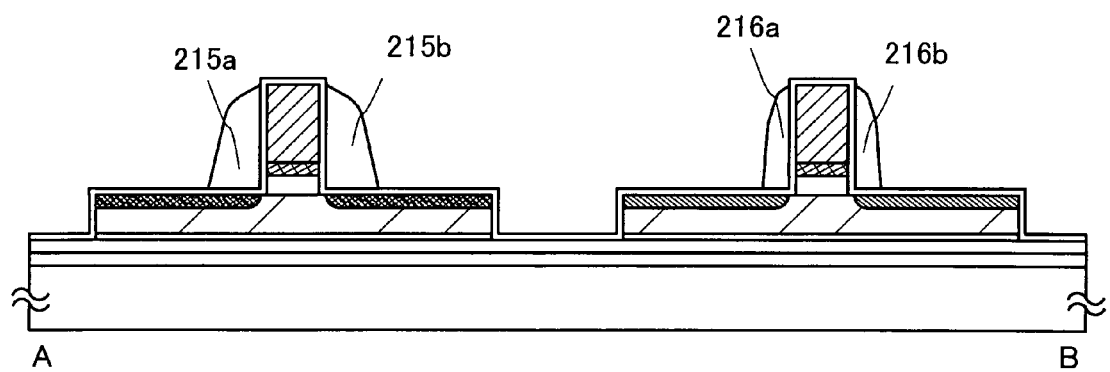

Next, a first sidewall 215 (215a and 215b) and a second sidewall 216 (216a and 216b) are formed on the side surfaces of the gate electrode layers (the first gate electrode layer 206 (206a and 206b) and the second gate electrode layer 207 (207a and 207b) (see FIGS. 9A and 9B). For example, the first sidewall 215 (215a and 215b) and the second sidewall 216 (216a and 216b) are each formed of a silicon nitride film. These sidewalls are formed in a self-aligned manner by anisotropic etching.

In this case, the first sidewall 215 (215a and 215b) on the SOI layer 203a side and the second sidewall 216 (216a and 216b) on the SOI layer 203b side may be processed in order to have the same width but preferably processed to have different widths. The width of the first sidewall 215 (215a and 215b) in the SOI layer 203a which becomes a p-type MISFET may be made thicker than the width of the second sidewall 216 (216a and 216b) in the SOI layer 203b which becomes part of an n-type MISFET. This is because, in the p-type MISFET, boron which is added in order to form source and drain regions are likely to be spread and a short-channel effect is likely to be induced. When such a structure is used, rather, in the p-type MISFET, boron can be added at high concentration to source and drain regions, and the source and drain regions can have low resistance.

After the sidewalls are formed, an exposed portion of the first insulating layer 208 is etched and the insulating layers 235a, 235b, 236a and 236b are formed. Next, the source and drain regions are formed in a self-aligned manner (see FIGS. 10A to 10C). The step of forming the source and drain regions can be performed by an ion irradiation method whereby irradiation with impurity ions, which control valence electrons, is performed by acceleration in an electric field.

Figure 10A:
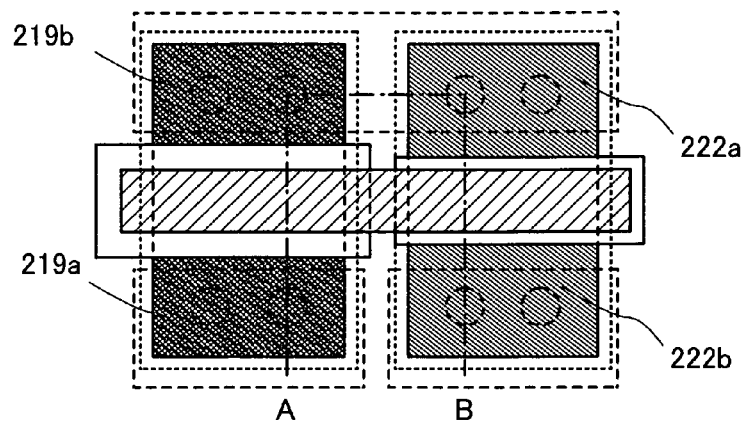
FIGS. 10A to 10C are views illustrating a method for manufacturing a semiconductor device of the present invention.
Figure 10B:
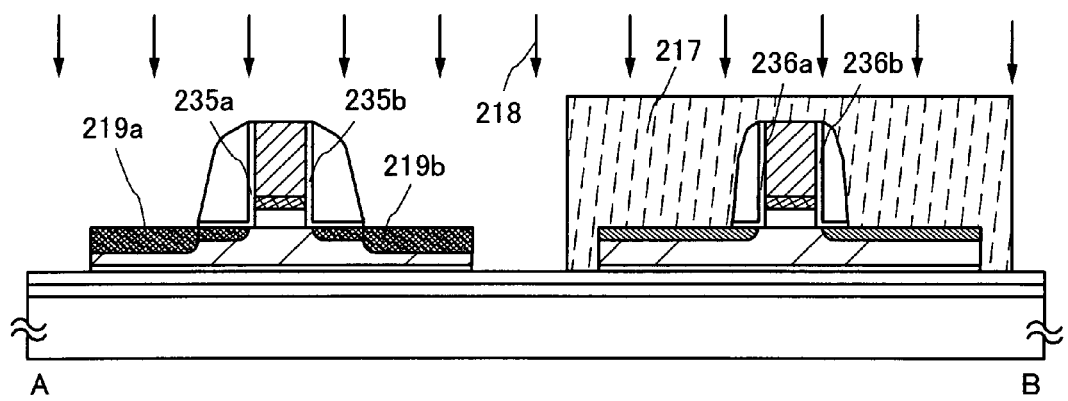
Figure 10C:
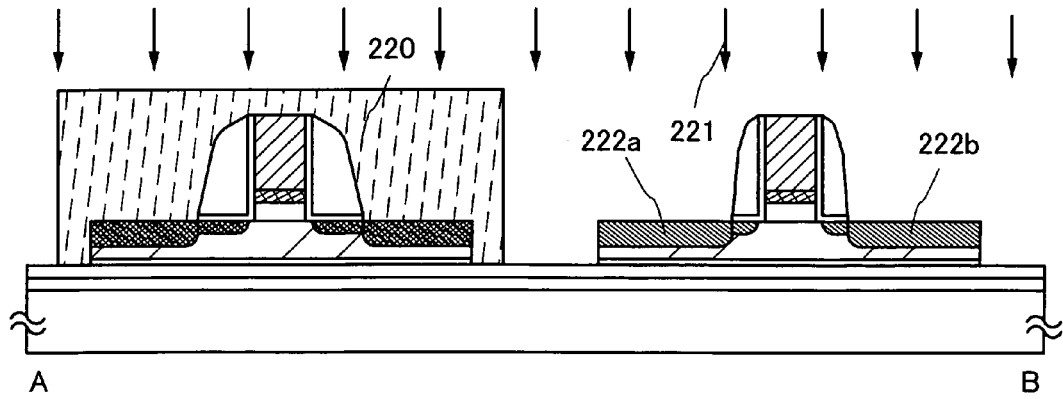

A mask 217 which covers the SOI layer 203b is formed; an impurity element 218 which is a Group 13 element is added to the SOI layer 203a, using the mask 217, the first gate electrode layer 206a, the second gate electrode layer 207a, and first side wall 215 (215a and 215b) as masks; and first impurity regions 219a and 219b which become source and drain regions are formed (see FIG. 10B). The mask 217 is removed; a mask 220 which covers the SOI layer 203a is formed; an impurity element 221 which is a Group 15 element is added to the SOI layer 203b, using the mask 220, the first gate electrode layer 206b, the second gate electrode layer 207b, and the second sidewall 216 (216a and 216b) as masks; and second impurity regions 222a and 222b which become source and drain regions are formed (see FIG. 10C).

For example, as to the SOI layer 203a for the p-type MISFET, boron ion irradiation is performed at 30 keV with a dose of $3 \times 10^{15}/cm^2$, and as to the SOI layer 203b for the n-type MISFET, arsenic ion irradiation is performed at 50 keV with a dose of $5 \times 10^{15}/cm^2$. Doping conditions such as kinds of ions, an accelerating voltage, and a dose may be set as appropriate.

A silicide layer may be formed in order to further reduce resistance of the source and drain regions. As the silicide layer, cobalt silicide or nickel silicide may be applied. When the SOI layer has a small thickness, a silicide reaction may be continued up to a bottom of the SOI layer of the source and drain regions so as to be fully silicided. A silicide is formed by forming a conductive film over the source and drain regions of the semiconductor layer which is exposed and making silicon in the semiconductor layer and the conductive film react by heat treatment, a GRTA method, an LRTA method, or the like. As a material of the conductive film, titanium (Ti), nickel (Ni), tungsten (W), molybdenum (Mo), cobalt (Co), zirconium (Zr), hafnium (Ha), tantalum (Ta), vanadium (V), neodymium (Nb), chromium (Cr), platinum (Pt), palladium (Pd), or the like is used. Alternatively, a silicide may be formed by light irradiation using laser irradiation or a lamp. A silicide can be controlled in shape or characteristics by film thickness of the conductive film which is used or a heat condition (temperature or time).

Figure 11A:
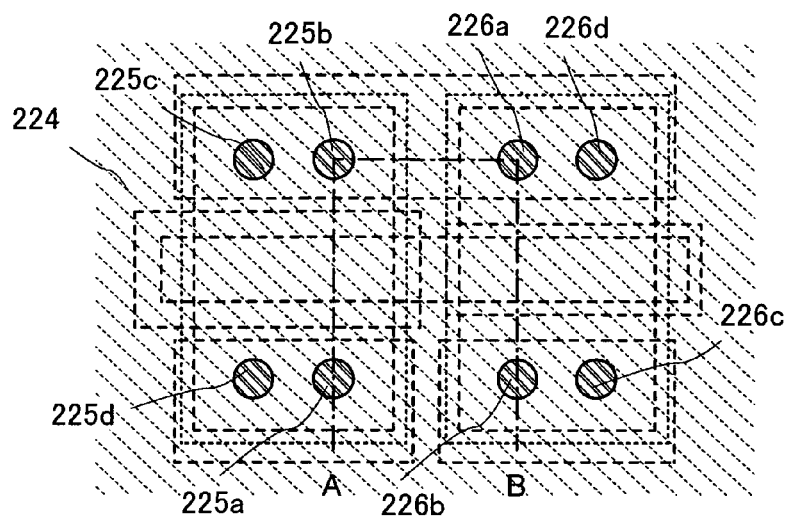
FIGS. 11A and 11B are views illustrating a method for manufacturing a semiconductor device of the present invention.
Figure 11B:
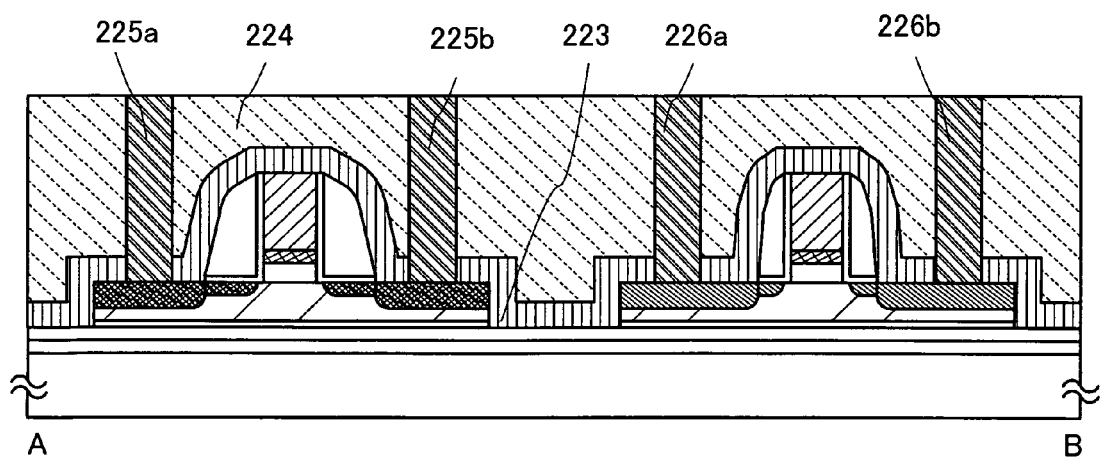
Figure 12A:
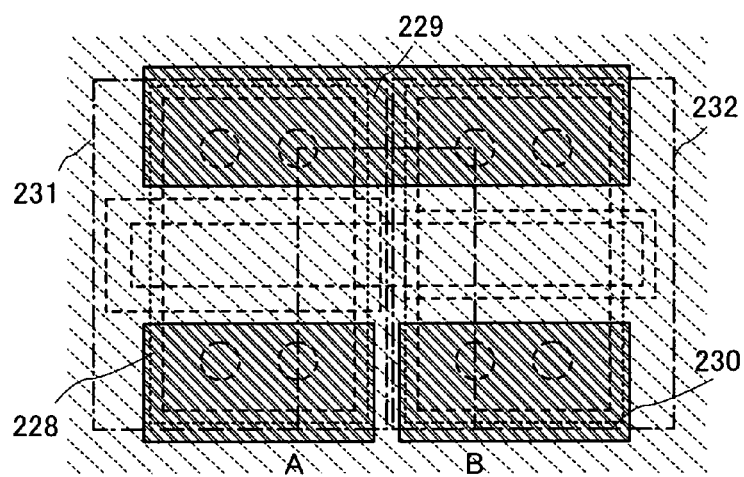
FIGS. 12A and 12B are views illustrating a method for manufacturing a semiconductor device of the present invention.
Figure 12B:
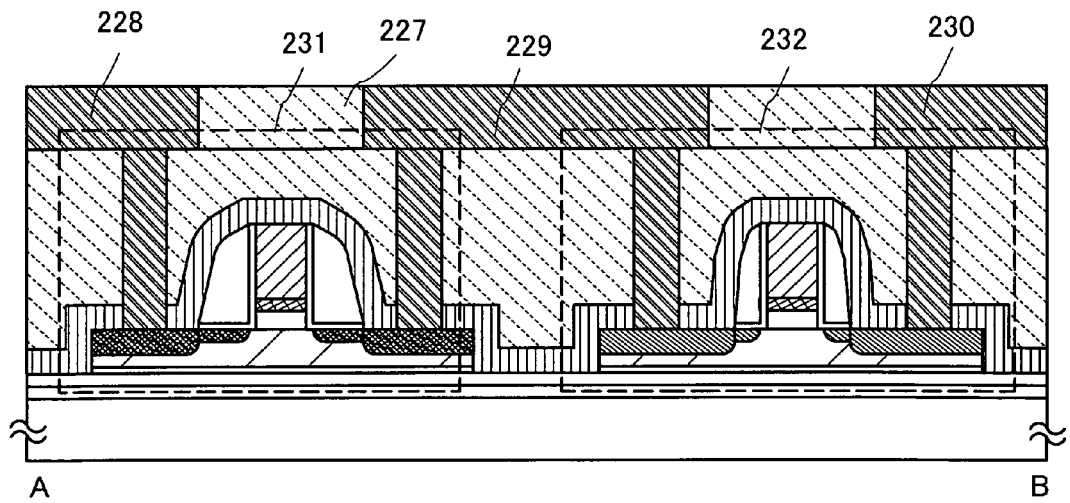

Steps of forming a passivation layer 223, a first interlayer insulating layer 224, contact plugs 225a to 225d, and 226a to 226d are described (see FIGS. 11A and 11B). As the passivation layer 223, a silicon nitride film, a silicon nitride oxide film, or the like is formed on the entire surface by a CVD method. As the first interlayer insulating layer 224, phosphorus silicate glass (PSG) or boron phosphorus silicate glass (BPSG) is formed by a CVD method and planarized by reflow. Alternatively, a silicon oxide film may be formed by a CVD method with the use of tetra-ethyl-ortho-silicate (Si(OCH$_2$CH$_3$)$_4$) and planarized by CMP after that. The contact plugs 225a to 225d and 226a to 226d are formed from a tungsten silicide so as to fill contact holes which is formed in the first interlayer insulating layer 224. A tungsten silicide is formed using tungsten hexafluoride (WF$_6$) and silane (SiH$_4$) by a CVD method.

Multilayer of a wiring is considered depending on a structure of a semiconductor device. This embodiment mode describes a structure in which a second interlayer insulating layer 227, a first wiring layer 228, a second wiring layer 229, and a third wiring layer 230 are provided over the first interlayer insulating layer 224 (see FIGS. 12A and 12B). These wiring layers may be formed from a tungsten silicide or by providing a Cu wiring by a damascene method.

According to the above steps, a semiconductor element 231 which is a p-type MISFET and a semiconductor element 232 which is an n-type MISFET can be manufactured. In this embodiment mode, an inverter circuit is manufactured as a semiconductor device using the present invention. According to this embodiment mode, since the island-shaped SOI layers are formed over the base substrate, a structure for separating elements is not necessary; thus, a manufacturing process can be simplified.

According to this embodiment mode using the present invention, a semiconductor element and an integrated semiconductor that have high performance can be manufactured with high throughput and high productivity.

Embodiment Mode 4

This embodiment mode will describe an example of a nonvolatile semiconductor memory device as a semiconductor device, object of which is to manufacture a semiconductor element and an integrated circuit that have high performance over a large-sized substrate with high throughput and high productivity, with reference to the drawings.

The nonvolatile memory element has a similar structure to that of a metal oxide semiconductor field effect transistor (MOSFET), in which a region capable of accumulating charges for a long period of time is provided over a channel formation region. This charge accumulation region is formed over an insulating layer and insulated from its periphery; therefore, it is also referred to as a floating gate electrode layer. In addition, since the floating gate electrode layer has a function to accumulate charges, it is also referred to as a charge accumulation layer. In this specification, the charge accumulation region mainly including a floating gate electrode layer is referred to as a charge accumulation layer. A control gate electrode layer is formed over the floating gate electrode layer with an insulating layer interposed therebetween.

A so-called floating gate type nonvolatile semiconductor memory device (simply referred to as a semiconductor device) having such a structure accumulates charges in the charge accumulation layer and releases the charges, based on the voltage applied to the control gate electrode layer. That is, the nonvolatile semiconductor memory device has a mechanism of storing data by taking charges into and out of the charge accumulation layer. Specifically, the injection and extraction of charges to and from the charge accumulation layer are performed by applying a high voltage between an SOI layer where the channel formation region is formed and the control gate electrode layer. It is said that Fowler-Nordheim type (an F-N type) tunneling current (a NAND-type) or a thermal electron (a NOR-type) flows through the insulating layer over the channel formation region at this time. Accordingly, the insulating layer is also referred to as a tunnel insulating layer.

Capacitance accumulated between the charge accumulation layer and the control gate electrode layer by using a second insulating layer as a dielectric, and capacitance accumulated between the charge accumulation layer and the SOI layer by using a first insulating layer as a dielectric can be controlled depending on a combination of the sizes of the SOI layer, the charge accumulation layer, and the control gate electrode layer; therefore, applied voltages can also be controlled.

For electron injection to the charge accumulation layer, there is a method utilizing thermoelectrons and a method utilizing F-N type tunnel current. In the case of a method utilizing thermoelectrons, thermoelectrons are generated by application of a voltage of positive polarity to the control gate electrode layer and high voltage to a drain. Accordingly, thermoelectrons can be injected into the charge accumulation layer. In the case of a method utilizing F-N type tunnel current, positive voltage is applied to the control gate electrode layer, and electrons are injected from the SOI layer to the charge accumulation layer by F-N type tunnel current.

Figure 19:
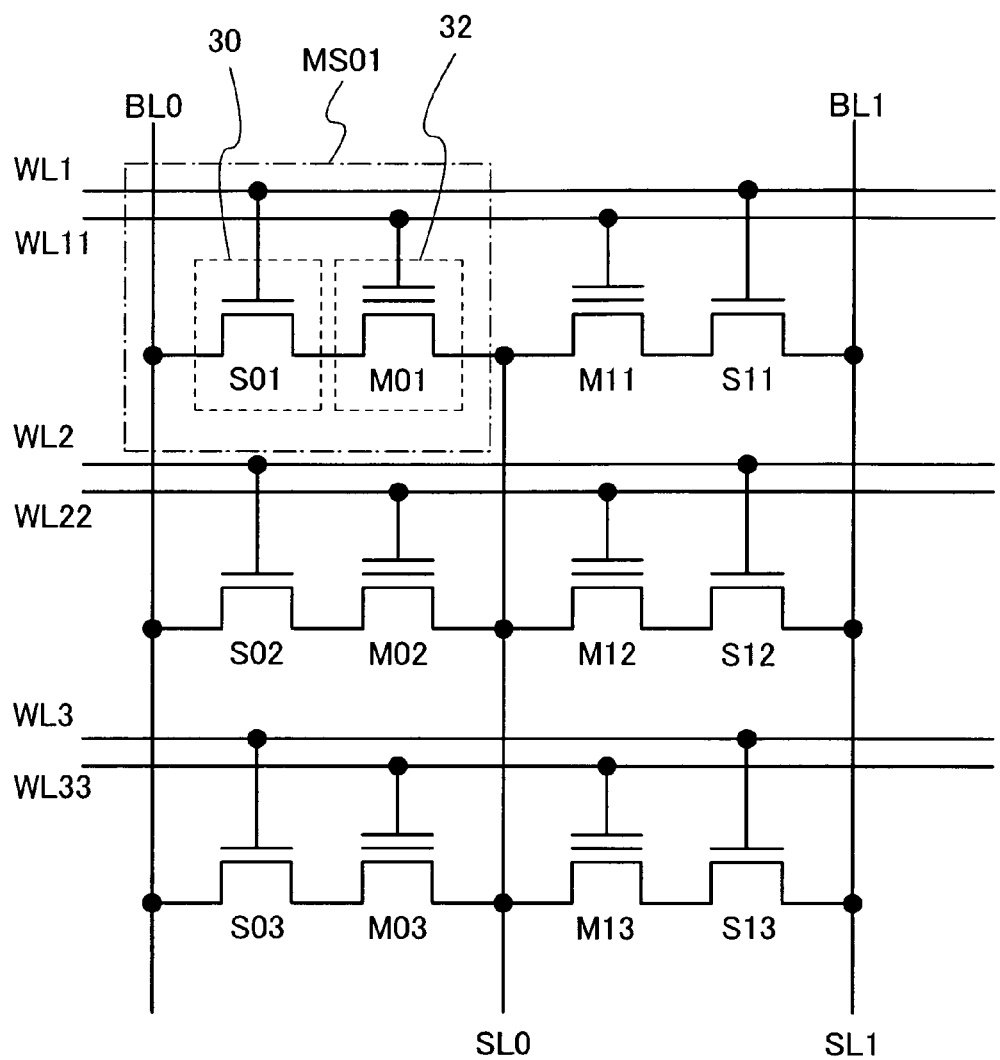
FIG. 19 is a diagram illustrating an example of an equivalent circuit of a semiconductor device of the present invention.

As an example of a semiconductor device using the present invention, a nonvolatile semiconductor memory device having a nonvolatile memory element can be obtained in various modes. FIG. 19 illustrates an example of an equivalent circuit of a nonvolatile memory cell array. A memory cell MS01 which stores one bit of information includes a select transistor S01 and a nonvolatile memory element M01. The select transistor S01 is inserted in series between a bit line BL0 and the nonvolatile memory element M01, and a gate of the select transistor S01 is connected to a word line WL1. Further, a gate of the nonvolatile memory element M01 is connected to a word line WL11. In order to write data to the nonvolatile memory element M01, potentials of the word line WL1 and the bit line BL0 are set at H level and a potential of a bit line BL1 is set at L level, and a high voltage is applied to the word line WL11, so that charge is stored in a charge accumulation layer. In order to erase data from the nonvolatile memory element M01, the potentials of the word line WL1 and the bit line BL0 may be set at H level and a high voltage of negative polarity may be applied to the word line WL11.

In the memory cell MS01, the select transistor S01 and the nonvolatile memory element M01 are formed using SOI layers 30 and 32, so that interference with other select transistors or nonvolatile memory elements can be prevented. Further, since the select transistor S01 and the nonvolatile memory element M01 in the memory cell MS01 are both n-channel, when they are both formed using a single SOI layer, a wiring for connecting the two elements can be omitted.

Figure 13:
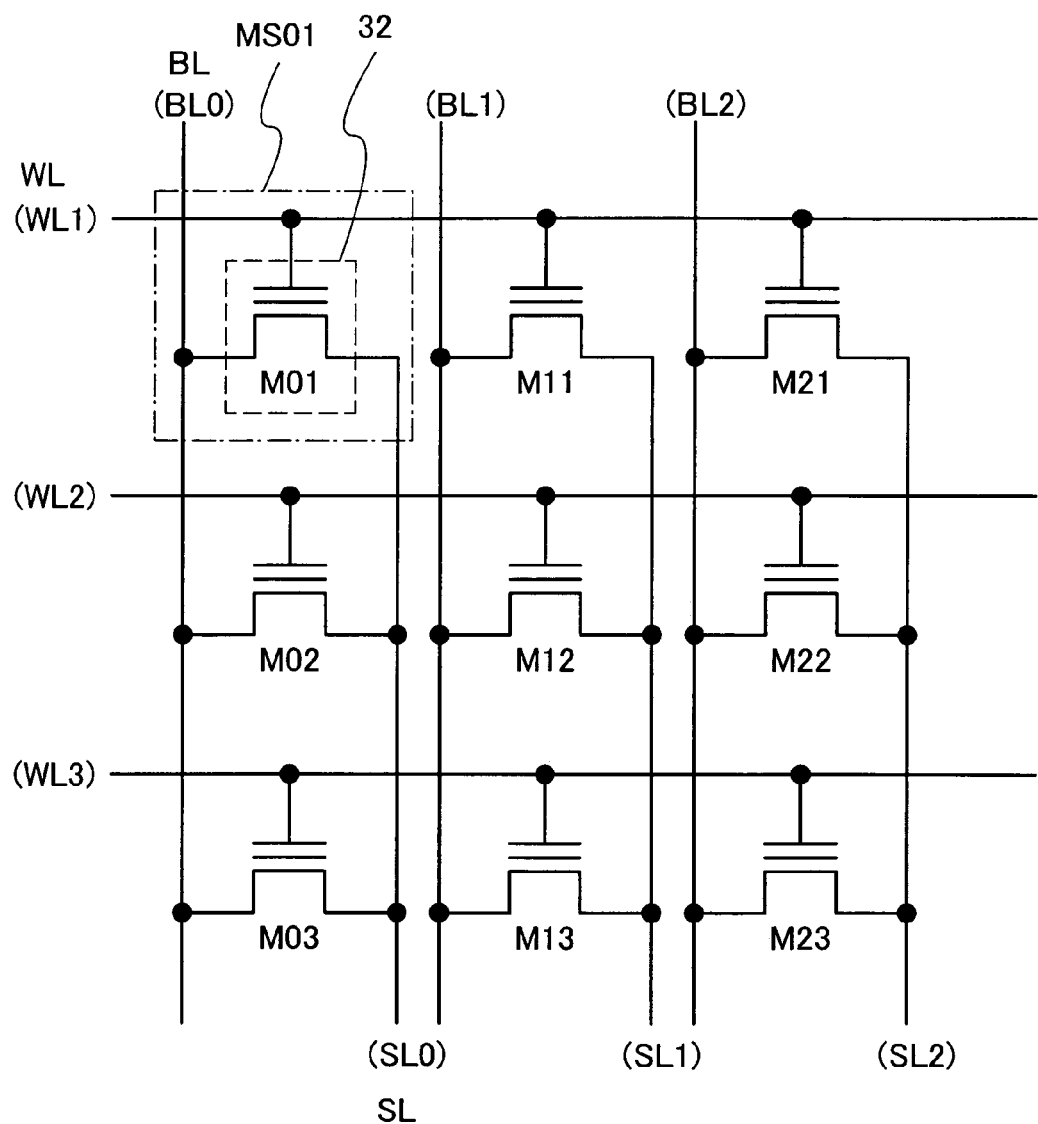
FIG. 13 is a diagram illustrating an example of an equivalent circuit of a semiconductor device of the present invention.

FIG. 13 illustrates an equivalent circuit of a NOR-type memory cell array in which a nonvolatile memory element is directly connected to a bit line. In this memory cell array, word lines WL and bit lines BL are disposed such that they cross each other, and a nonvolatile memory element is disposed at each intersection. In the case of a NOR-type memory cell array, a drain of each nonvolatile memory element is connected to a bit line BL. Sources of the nonvolatile memory elements are connected in common to source lines SL.

Further, when a plurality of nonvolatile memory elements (for example, M01 to M23 in FIG. 13) are treated as a single block, and these nonvolatile memory elements are formed using a single SOI layer, erasing operations can be performed in block units.

Operations of a NOR-type memory cell array are, for example, as follows. For data writing, a source line SL is set to 0 V, a high voltage is applied to a word line WL selected for writing of data, and a potential corresponding to data "0" or data "1" is applied to a bit line BL. For example, potentials of H level and L level for data "0" and data "1", respectively, are applied to the bit line BL. In a nonvolatile memory element supplied with H-level potential for writing data "0", hot electrons are generated near the drain, and are injected into the charge accumulation layer. Such electron injection does not occur in the case of data "1".

In a memory cell to which data "0" is supplied, hot electrons are generated near the drain by a strong transverse electric field between the source and the drain, and are injected into the charge accumulation layer. The consequent state in which the threshold voltage has been increased by the electrons injected into the charge accumulation corresponds to "0". In the case of data "1", hot electrons are not generated, and a state in which electrons are not injected into the charge accumulation layer and the threshold voltage is low, that is, an erasing state, is retained.

When data is to be erased, a voltage of positive polarity of approximately 10 V is applied to the source line SL, and the bit line BL is put in a floating state. Then, a high voltage of negative polarity is applied to the word line (a high voltage of negative polarity is applied to a control gate), so that electrons are drawn out from the charge accumulation layer. Accordingly, an erasing state, data "1" is obtained.

In a data reading operation, the source line SL is set to 0 V; the bit line BL is set to approximately 0.8 V; a reading voltage, which is set at the intermediate value of the threshold voltage when data is "0" and the threshold voltage when data of "1", is applied to a selected word line WL; and a sense amplifier connected to the bit line BL determines whether or not current of the nonvolatile memory element has been drawn.

Figure 14:
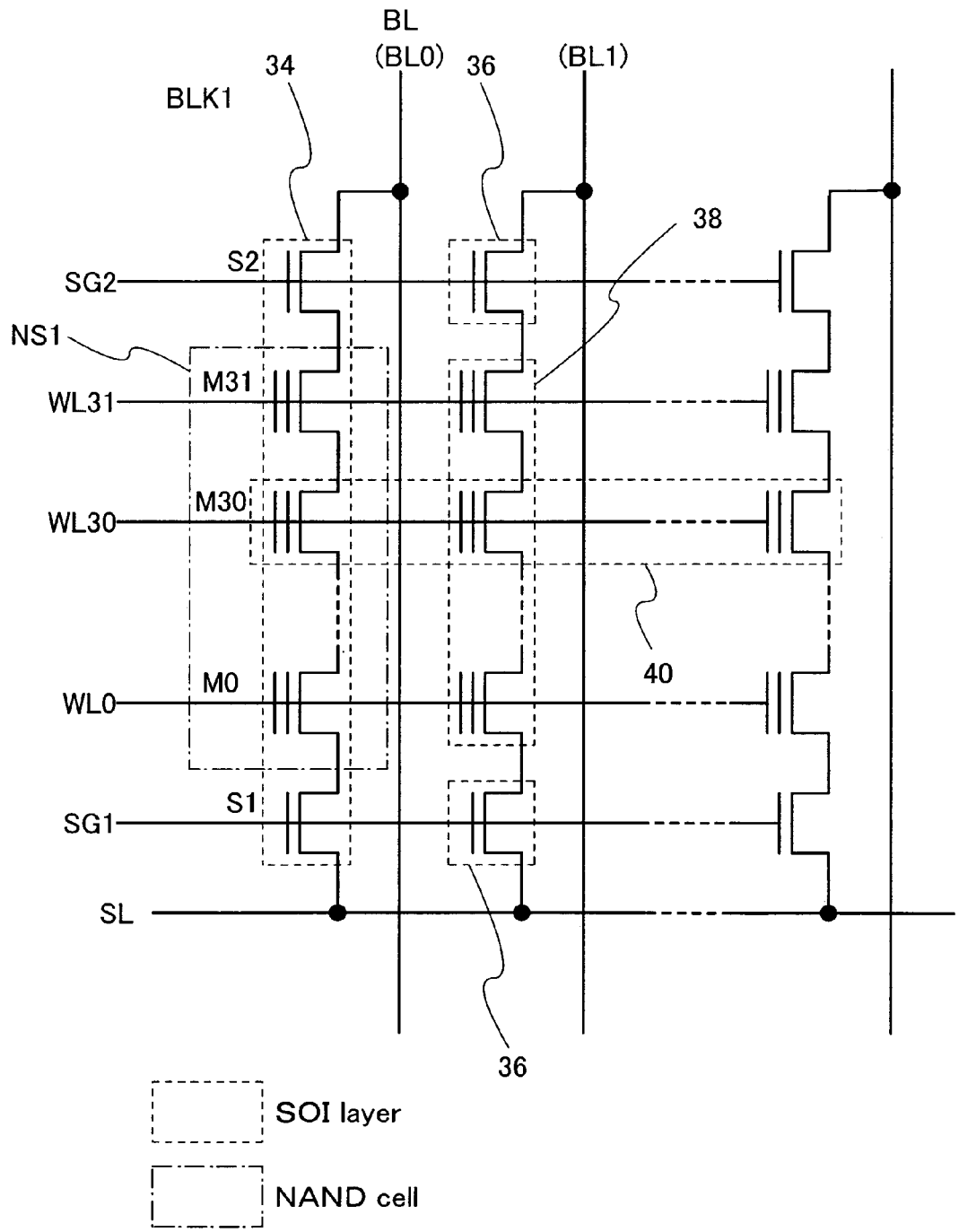
FIG. 14 is a diagram illustrating an example of an equivalent circuit of a semiconductor device of the present invention.

FIG. 14 illustrates an equivalent circuit of a NAND-type memory cell array. A NAND cell NS1, in which a plurality of nonvolatile memory elements are connected in series, is connected to a bit line BL. A block BLK includes a plurality of NAND cells which are grouped together. A block BLK1 illustrated in FIG. 14 has 32 word lines (word lines WL0 to W131). Nonvolatile memory elements disposed in the same row in the block BLK1 are connected in common to a word line which corresponds to that row.

In this case, since select transistors S1 and S2 and nonvolatile memory elements M0 to M31 are connected in series, they may be formed as a single group using a single SOI layer 34. Accordingly, a wiring for connecting the nonvolatile memory elements can be omitted; thus, integration can be achieved. Further, adjacent NAND cells can be separated easily. Alternatively, SOI layers 36 of the select transistors S1 and S2 may be separated from an SOI layer 38 of the NAND cell NS1. Accordingly, an erasing operation during which electrons are extracted from the charge accumulation layer of each of the nonvolatile memory cells M0 to M31 can be performed in NAND cell units. Alternatively, nonvolatile memory elements connected to a common word line (for example, those in the row of the nonvolatile memory element M30) may be formed with a single semiconductor layer.

A writing operation is carried out after the NAND cell NS1 is put into an erasure state, that is, a state in which the threshold value of each nonvolatile memory element of the NAND cell NS1 is in a negative voltage state. Writing is performed in order from the memory element M0 on the source line SL side. The writing operation will be roughly described below, using writing to the memory element M0 as an example.

As illustrated in FIG. 26A, in the case where "0" is written, $V_{cc}$ (a power supply voltage) is applied to a select gate line SG2 to turn a select transistor S2 on, and the bit line BL0 is set to 0 V (ground voltage), for example. Further, the voltage of a select gate line SG1 is set to 0 V and the select transistor S1 is turned off. Next, the voltage of the word line WL0 connected to the nonvolatile memory element M0 is set to be a high voltage $V_{pgm}$ (approximately 20 V), and the voltage of the other word lines is set to be an intermediate voltage $V_{pass}$ (approximately 10 V). Since the voltage of the bit line BL is 0 V, the potential of a channel formation region of the selected nonvolatile memory element M0 is 0 V. Since the potential difference between the word line WL0 and the channel formation region of the nonvolatile memory element M0 is large, electrons are injected into the charge accumulation layer of the nonvolatile memory element M0 by F-N tunneling current, as described above. Accordingly, the threshold voltage of the nonvolatile memory element M0 changes to a state of positive polarity (a state in which "0" is written).

On the other hand, in the case of writing "1", as illustrated in FIG. 26B, $V_{cc}$ (a power supply voltage) is applied to the bit line BL, for example. Since the voltage of a select gate line SG2 is $V_{cc}$, when a gate voltage of the select transistor S2 becomes $V_{th} > V_{cc}$, the select transistor S2 is cut off. Therefore, a channel formation region of the nonvolatile memory element M0 becomes a floating state. Next, when a high voltage $V_{pgm}$ (20 V) is applied to the word line WL0, and an intermediate voltage $V_{pass}$ (10 V) is applied to the other word lines, through capacitive coupling of each word line and the channel formation region, the voltage of the channel formation region increases from $V_{cc}-V_{th}$ to become, for example, approximately 8 V. The voltage of the channel formation region is boosted to a high voltage; however, a potential difference between the word line WL0 and the channel forming region of the nonvolatile memory element M0 is small, in contrast to the case where "0" is written. Therefore, electron injection by F-N tunneling current does not occur in the charge accumulation layer of the nonvolatile memory element M0. Accordingly, a state of negative polarity (a state where "1" is written) of the threshold value of the nonvolatile memory element M0 is retained.

Figure 27A:
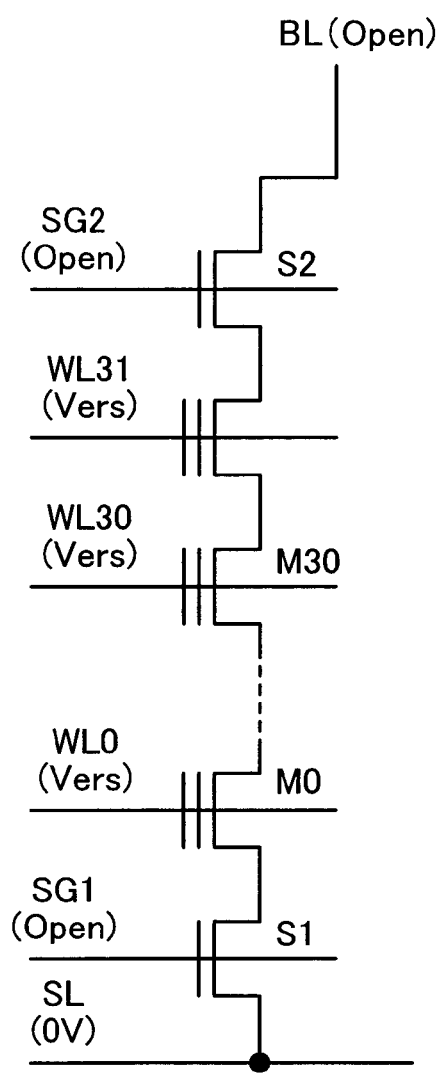
FIGS. 27A and 27B are diagrams illustrating erasing and reading operations of a semiconductor device.

When an erasing operation is performed, as illustrated in FIG. 27A, a high voltage of negative polarity ($V_{ers}$) is applied to the selected word lines; and a voltage $V_{on}$ (for example, 3 V) is applied to the word lines WL1 to WL31, the select gate line SG1, and the select gate line SG2 of the non-selected nonvolatile memory element; and an open voltage $V_{open}$ (0 V) is applied to the bit line BL and the source line SL. Then, as described in this embodiment mode, electrons in the charge accumulation layer of the selected nonvolatile memory element can be released. As a result, threshold voltages of the selected nonvolatile memory elements shift to the negative direction.

Figure 27B:
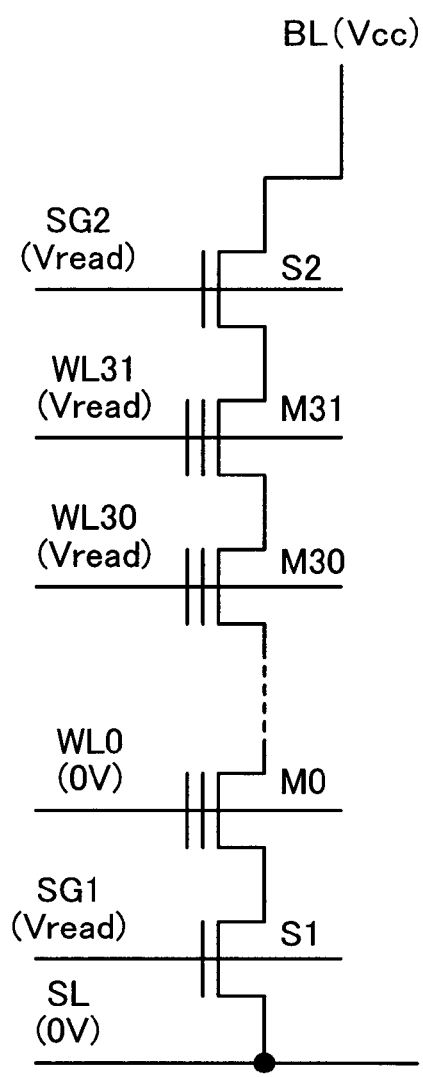

In a reading operation illustrated in FIG. 27B, a voltage of the word line WL0 which is connected to the nonvolatile memory element M0 selected for reading is set to $V_r$ (for example, 0 V), and the word lines WL1 to WL31 of non-selected memory cells and the select gate lines SG1 and SG2 are set to an intermediate voltage $V_{read}$ for reading, which is slightly higher than the power supply voltage. That is, as illustrated in FIG. 13, the memory elements other than the selected memory elements function as transfer transistors. Accordingly, it is detected whether or not current is flowing through the nonvolatile memory element M0 selected for reading. That is, when the data stored in the nonvolatile memory element M0 is "0", the nonvolatile memory element M0 is off, so that the bit line BL does not discharge electricity. On the other hand, in the case where the data stored in the nonvolatile memory element cell M0 is "1", the nonvolatile memory element M0 is turned on, so that the bit line BL discharges electricity.

In this embodiment mode, when single crystal semiconductor layers are transferred from a bond wafer, a single crystal semiconductor substrate is etched selectively (this step is also referred to as groove processing), and a plurality of single crystal semiconductor layers divided such that they have the size of semiconductor elements to be manufactured are transferred to a different substrate (a base substrate). Thus, a plurality of island-shaped single crystal semiconductor layers (SOI layers) can be formed as SOI layers which are included in the above NOR-type memory cell array and NAND-type memory cell array. Since the single crystal semiconductor layers which are processed into an element size in advance are transferred, transfer to the base substrate can be performed in units of the single crystal semiconductor layers; thus, the size and shape of the single crystal semiconductor substrate are not restricted. Therefore, transfer of single crystal semiconductor layers to a large-sized substrate can be performed more efficiently. Further, a manufacturing process can be simplified because an element isolation region does not have to be formed.

Further, in the present invention, etching is performed on the SOI layers formed over the base substrate, and the forms of the SOI layers are controlled precisely by processing and modifying the SOI layers. Accordingly, discrepancy in formation position and defects in shape of the SOI layer due to pattern misalignment caused by light exposure going around a resist mask, or the like during resist mask formation; position misalignment caused by a bonding step during transfer; or the like can be modified.

Thus, a plurality of single crystal semiconductor layers (SOI layers) having a desired shape can be formed over a base substrate with a high yield, according to this embodiment mode using the present invention. Accordingly, a semiconductor device, which includes a semiconductor element and an integrated circuit that have more precision and high performance, can be manufactured over a large-sized substrate with high throughput and high productivity.

Embodiment Mode 5

Figure 15:
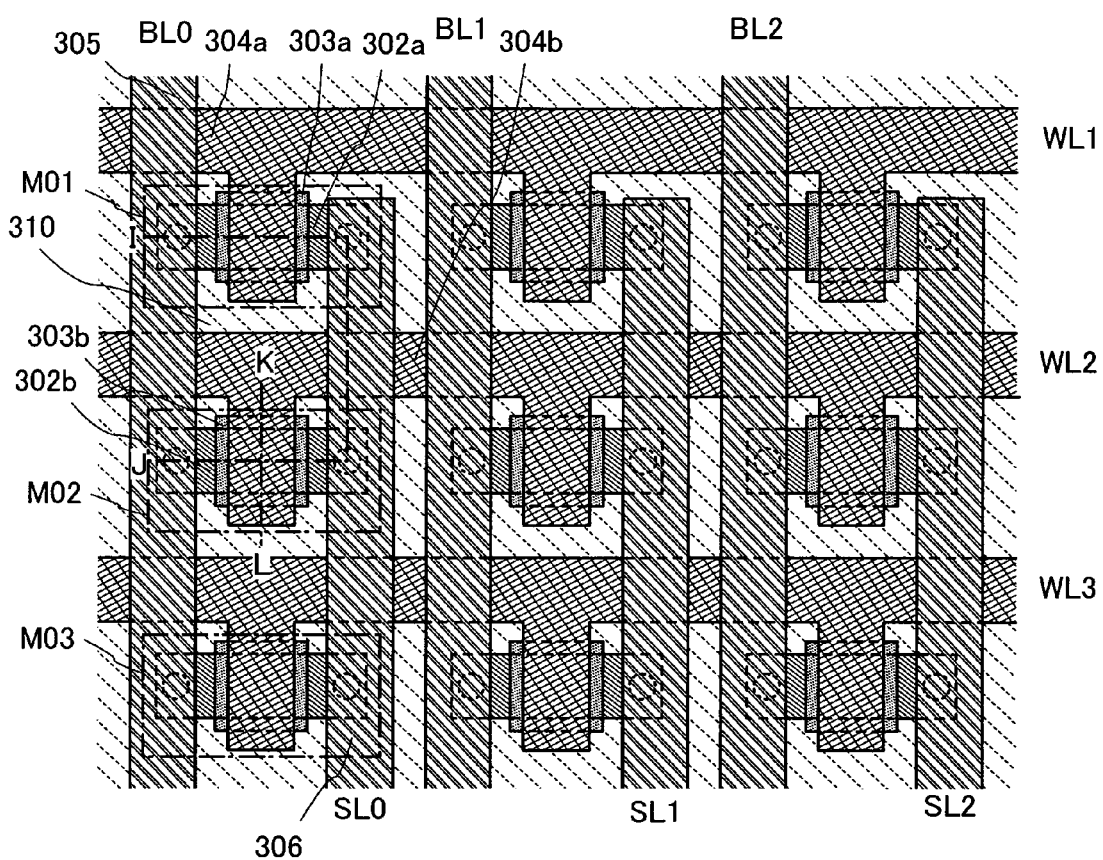
FIG. 15 is a plan view illustrating a semiconductor device of the present invention.
Figure 16A:
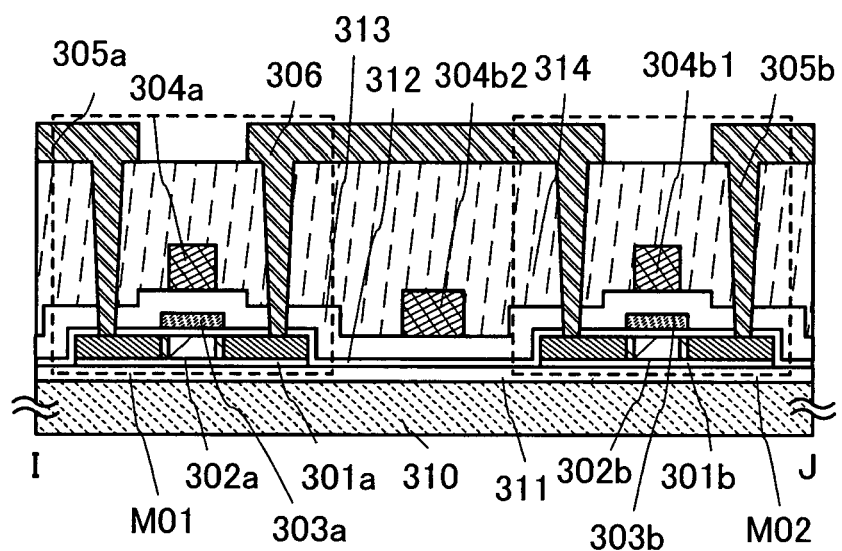
FIGS. 16A and 16B are cross-sectional views illustrating a semiconductor device of the present invention.
Figure 16B:
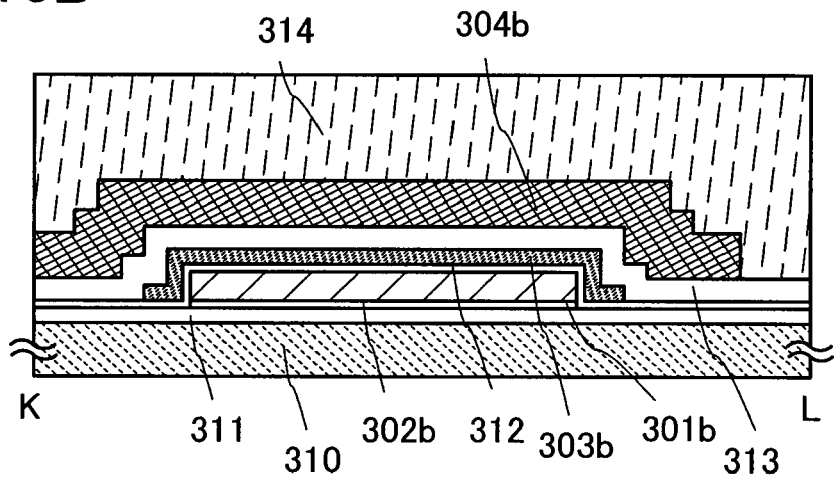

This embodiment mode will describe an example of a semiconductor device having a memory element as a semiconductor device, an object of which is to manufacture a semiconductor element and an integrated circuit that have high performance over a large-sized substrate with high throughput and high productivity, with reference to the drawings. FIG. 15 illustrates a top view of a semiconductor device of this embodiment mode, FIG. 16A illustrates a cross-sectional view taken along line I-L of FIG. 15, and FIG. 16B illustrates a cross-sectional view taken along line K-L of FIG. 15.

FIG. 15 illustrates an equivalent circuit of a NOR-type memory cell array in which nonvolatile memory elements M (M01, M02, and M03) are directly connected to bit lines BL (BL0, BL1, and BL2). In this memory cell array, word lines WL (WL1, WL2, WL3) and the bit lines BL (BL0, BL1, and BL2) are disposed such that they cross each other, and the nonvolatile memory elements M (M01, M02, and M03) are disposed at respective intersections. In the case of the NOR-type memory cell array, a drain of each of the nonvolatile memory elements M (M01, M02, and M03) is connected to the bit lines BL (BL0, BL1, and BL2). Sources of the nonvolatile memory elements are connected in common to source lines SL (SL0, SL1, and SL2).

In FIG. 15, the memory elements M01, M02, and M03 have drains which are connected to bit lines BL0 305 (305*a* and 305*b*) and sources which are connected to a source line SL0 306. The memory element M01 includes an SOI layer 302*a*, a charge accumulation layer 303*a*, and a control gate electrode layer 304*a*; the memory element M02 includes an SOI layer 302*b*, a charge accumulation layer 303*b*, and a control gate electrode layer 304*b*; and a first insulating layer 312, a second insulating layer 313, and an interlayer insulating layer 314 are sequentially formed to the memory elements M01 and M02. Note that the SOI layers 302*a* and 302*b* each have a channel formation region, and a high-concentration n-type impurity region and a low-concentration n-type impurity region which function as a source and a drain.

The SOI layer 302*a* which is included in the memory element M01 and the SOI layer 302*b* which is included in the memory element M02 are divided into island shapes and electrically isolated without forming an element isolation region.

As illustrated in FIGS. 16A and 16B, an insulating layer 311 in which a silicon nitride layer and a silicon oxide layer are sequentially stacked from the side of a base substrate 310 is provided over the base substrate 310, and the SOI layers 302a and 302b are provided over the insulating layer 311, with silicon oxide layers 301a and 301b interposed therebetween. Also as to the SOI layers 302a and 302b, with the use of the present invention, single crystal semiconductor regions are formed in the shapes of the SOI layers 302a and 302b over a bond wafer, and the island-shaped SOI layers 302a and 302b are transferred to the base substrate 310 and further processed into desired shapes over the base substrate. Groove processing is performed on the bond wafer, a plurality of the SOI layers are processed into desired shapes, and then the SOI layers are transferred to the base substrate, so that restriction on the shape or size of the bond wafer itself can be reduced and the SOI layers can be transferred to a large-sized substrate with high throughput. Further, a manufacturing process can be simplified because an element isolation region is not necessarily formed. The shapes of the SOI layers after being transferred are further processed, so that the shapes of the SOI layers can be controlled more precisely. Thus, since an SOI layer which is controlled accurately can be obtained, a yield is improved and reliability of a semiconductor device which is obtained is also improved. Therefore, a semiconductor element and an integrated circuit that have high performance can be manufactured with high productivity.

Combinations in size of SOI layers, charge accumulation layers, and control gate electrode layers are not limited to those in FIGS. 15, 16A and 16B. Capacitance accumulated in the second insulating layer 313 between the charge accumulation layer and the control gate electrode layer, and capacitance accumulated in the first insulating layer 312 between the charge accumulation layer and the SOI layer can be controlled by combinations in size of the element regions, the charge accumulation layers, and the control gate electrode layers. Therefore, a value of voltage which is applied can also be controlled.

The first insulating layer 312 may be formed of silicon oxide or a stacked-layer structure of silicon oxide and silicon nitride. The first insulating layer 312 may be formed by deposition of an insulating layer by a plasma CVD method or a low-pressure CVD method; however, the first insulating layer 312 is preferably formed by solid-phase oxidation or solid-phase nitridation by plasma treatment. This is because the insulating layer formed using the SOI layer (typically, a silicon layer) on which oxidation or nitridation by plasma treatment is performed has denseness, high withstand voltage, and excellent reliability. Since the first insulating layer 312 is used as a tunnel insulating layer for injecting charge into the charge accumulation layers 303a and 303b, the first insulating layer 312 preferably has such strength. It is preferable that this first insulating layer 312 be formed to a thickness of greater than or equal to 1 nm and less than or equal to 20 nm, more preferably, greater than or equal to 3 nm and less than or equal to 6 nm. For example, in the case where gate length is set to be 600 nm, the first insulating layer 312 can be formed to a thickness of greater than or equal to 3 nm and less than or equal to 6 nm.

A surface of a silicon layer that is a typical example of the SOI layer is oxidized by plasma treatment, whereby a dense oxide layer without distortion at an interface can be formed. In addition, when the oxide layer is nitrided by plasma treatment and nitrogen is substituted for oxygen at the surface part to form a nitride layer, the layer can be made denser. Accordingly, an insulating layer with high withstand voltage can be formed.

In any event, when the solid-phase oxidation treatment or solid-phase nitridation treatment by the plasma treatment as described above is used, an insulating layer that is equivalent to a thermal oxide film formed at a temperature of 950 to 1050° C. can be obtained even when a glass substrate having allowable temperature limit of less than or equal to 700° C. is used. That is, a tunnel insulating layer with high reliability can be formed as the tunnel insulating layer of the nonvolatile memory element.

The charge accumulation layers 303a and 303b are formed over the first insulating layer 312. As each of the charge accumulation layers 303a and 303b, a single layer may be formed or a plurality of layers may be stacked.

Each of the charge accumulation layers 303a and 303b can be a floating gate formed of a layer or particles of a semiconductor material or a conductive material. As the semiconductor material, silicon, silicon germanium, or the like can be used. When silicon is used, amorphous silicon or polysilicon can be used. Further, polysilicon doped with phosphorus can also be used. As the conductive material, an element selected from tantalum (Ta), titanium (Ti), molybdenum (Mo), or tungsten (W); an alloy containing the above element as its main component; an alloy film in which the above elements are combined (typically, an Mo—W alloy film or an Mo—Ta alloy film); or a silicon film provided with conductivity may be used. Under the conductive layer formed of such a material, a nitride such as tantalum nitride, tungsten nitride, titanium nitride, or molybdenum nitride; or a silicide such as tungsten silicide, titanium silicide, or molybdenum silicide may be formed. Furthermore, a stacked-layer structure of the above-described semiconductor materials, conductive materials, or the semiconductor material and the conductive material may be employed. For example, a stacked-layer structure of a silicon layer and a germanium layer may be employed.

Alternatively, the charge accumulation layers 303a and 303b can be formed as an insulating layer having a trap that holds charges. As a typical example of such materials, a silicon compound or a germanium compound can be given. As the silicon compound, silicon nitride, silicon oxynitride, silicon oxynitride to which hydrogen is added, or the like can be used. As the germanium compound, germanium nitride, germanium nitride to which oxygen is added, germanium oxide to which nitrogen is added, germanium nitride to which oxygen and hydrogen are added, germanium oxide to which nitrogen and hydrogen are added, or the like can be used.

The second insulating layer 313 is formed by a low-pressure CVD method, a plasma CVD method, or the like, using one or a plurality of layers of silicon oxide, silicon oxynitride, silicon nitride, silicon nitride oxide, aluminum oxide, and the like. In addition, the charge accumulation layers 303a and 303b may be subjected to plasma treatment, and thus, a nitride film which is formed by nitriding the surfaces thereof (for example, silicon nitride, in a case where silicon is used as the charge accumulation layers 303a and 303b) may be formed. In any case, when one or both of the sides, in which the first insulating layer 312 and the second insulating layer 313 are in contact with the charge accumulation layers 303a and 303b, is/are a nitride film or a layer subjected to nitridation treatment, the charge accumulation layers 303a and 303b can be prevented from being oxidized The control gate electrode layers 304a, 304b1, and 304b2 are preferably formed using metal selected from tantalum (Ta), tungsten (W), titanium (Ti), molybdenum (Mo), chromium (Cr), niobium (Nb), or the like, or an alloy material or a compound material containing any of the metals as its main component. Alternatively, polycrystal silicon to which an impurity element such as phosphorus is added can be used. Further alternatively, the control gate electrode layers 304a, 304b1, and 304b2 may be formed using a stacked-layer structure of one or a plurality of layers, such as a metal nitride layer and a layer of any of the above metals. As the metal nitride, tungsten nitride, molybdenum nitride, or titanium nitride can be used. By provision of the metal nitride layer, adhesion of the metal layer can be improved; therefore, the metal layer can be prevented from separation.

For a wiring layer such as the bit line BL0 305, a material can be selected from the following: indium tin oxide (ITO); indium zinc oxide (IZO) in which zinc oxide (ZnO) is mixed with indium oxide; a conductive material in which silicon oxide ($SiO_2$) is mixed with indium oxide; organic indium; organic tin; indium oxide containing tungsten oxide; indium zinc oxide containing tungsten oxide; indium oxide containing titanium oxide; indium tin oxide containing titanium oxide; or a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), or an alloy or a metal nitride thereof.

This embodiment mode can be implemented in combination with any of other embodiment modes described in this specification.

In this embodiment mode, when single crystal semiconductor layers are transferred from a bond wafer, a single crystal semiconductor substrate is etched selectively (this step is also referred to as groove processing), and a plurality of single crystal semiconductor layers divided such that they have the size of semiconductor elements to be manufactured are transferred to a different substrate (a base substrate). Thus, a plurality of island-shaped single crystal semiconductor layers (SOI layers) can be formed over the base substrate. Since the single crystal semiconductor layers which are processed into an element size in advance are transferred, transfer to the base substrate can be performed in units of the single crystal semiconductor layers; thus, the size and shape of the single crystal semiconductor substrate are not restricted. Therefore, transfer of single crystal semiconductor layers to a large-sized substrate can be performed more efficiently. Further, a manufacturing process can be simplified because an element isolation region does not have to be formed.

Further, in the present invention, etching is performed on the SOI layers formed over the base substrate, and the forms of the SOI layers are controlled precisely by processing and modifying the SOI layers. Accordingly, discrepancy in formation position and defects in shape of the SOI layer due to pattern misalignment caused by light exposure going around a resist mask, or the like during resist mask formation; position misalignment caused by a bonding step during transfer; or the like can be modified.

Thus, a plurality of single crystal semiconductor layers (SOI layers) having a desired shape can be formed over a base substrate with a high yield, according to this embodiment mode using the present invention. Accordingly, a semiconductor device, which includes a semiconductor element and an integrated circuit that have more precision and high performance, can be manufactured over a large-sized substrate with high throughput and high productivity.

Embodiment Mode 6

Figure 17:
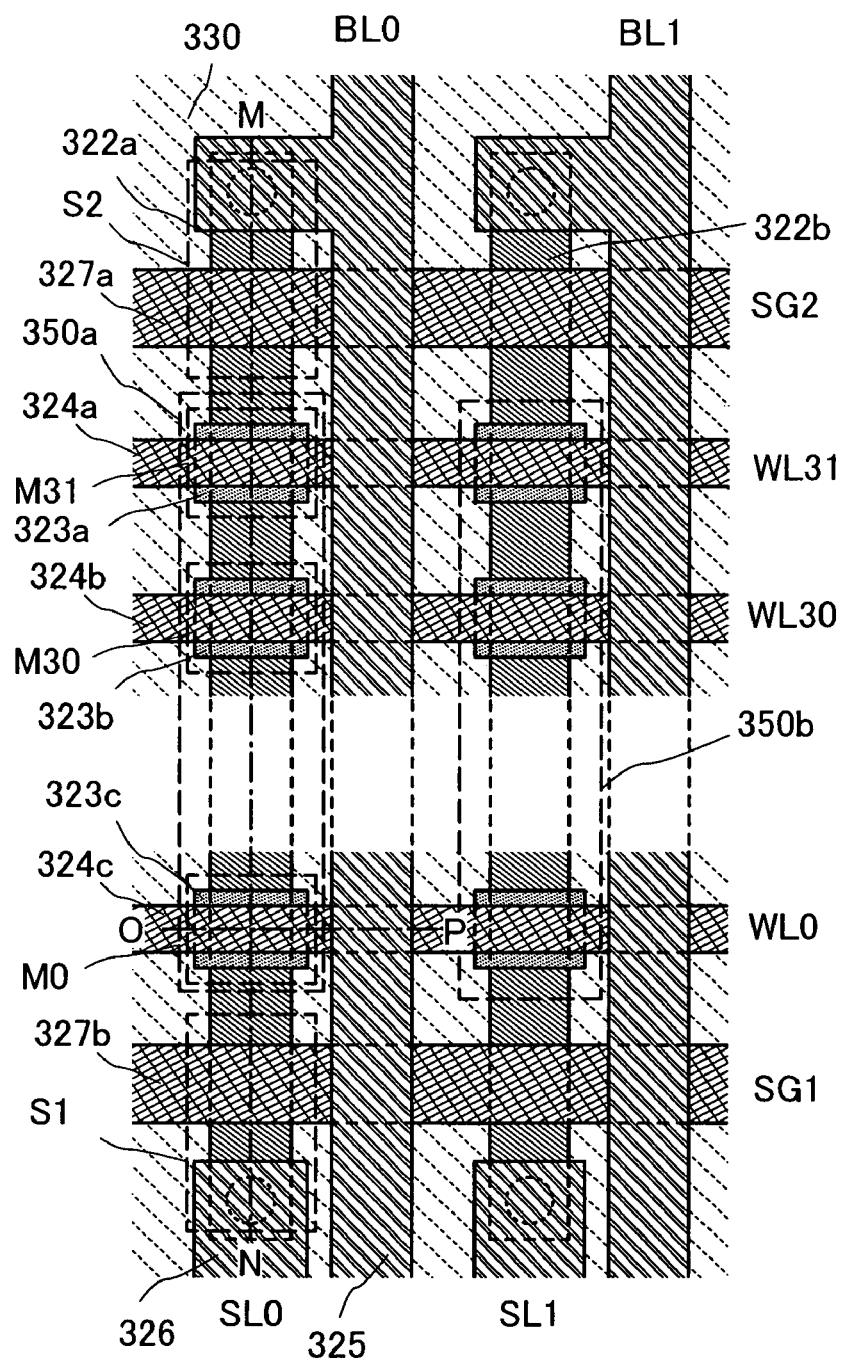
FIG. 17 is a plan view illustrating a semiconductor device of the present invention.

This embodiment mode will describe an example of a semiconductor device having a memory element as a semiconductor device, an object of which is to manufacture a semiconductor element and an integrated circuit that have high performance over a large-sized substrate with high throughput and high productivity, with reference to the drawings. FIG. 17 illustrates a top view of a semiconductor device of this embodiment mode, FIG. 18A illustrates a cross-sectional view taken along line M-N of FIG. 17, and FIG. 18B illustrates a cross-sectional view taken along line O-P of FIG. 17.

This embodiment mode will describe a case, where one SOI layer is provided with a plurality of nonvolatile memory elements, with reference to the drawings. Note that description is omitted in cases where the same portions as those in the above embodiment modes are referred.

Figure 18A:
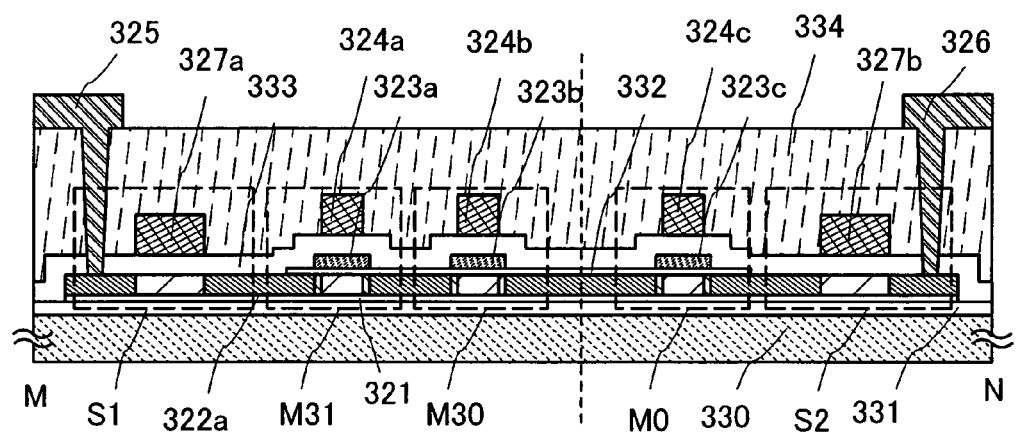
FIGS. 18A and 18B are cross-sectional views illustrating a semiconductor device of the present invention.
Figure 18B:
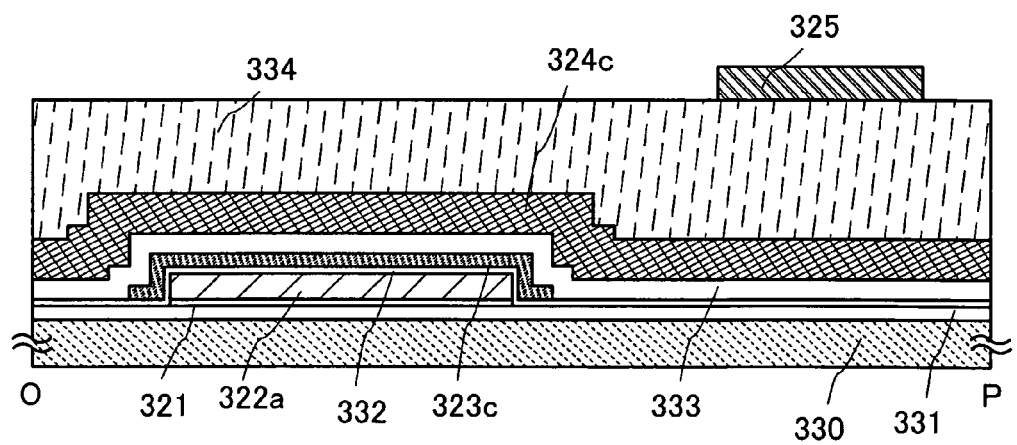

A semiconductor device described in this embodiment mode is provided with SOI layers 322a and 322b which are electrically connected to bit lines BL0 and BL1, respectively, and the SOI layers 322a and 322b are each provided with a plurality of nonvolatile memory elements (see FIGS. 17, 18A, and 18B). Specifically, in the SOI layer 322a, a NAND-type cell 350a having a plurality of nonvolatile memory elements M0, M30, and M31 are provided between select transistors S1 and S2. In addition, also in the SOI layer 322b, a NAND-type cell 350b having a plurality of nonvolatile memory elements is provided between select transistors. Further, the adjacent, NAND-type cell 350a and NAND-type cell 350b can be insulated by isolating the SOI layers 322a and 322b to be island-shaped SOI layers.

In addition, one SOI layer is provided with a plurality of nonvolatile memory elements, so that more integration of the nonvolatile memory elements can be realized and thus a large-capacity nonvolatile semiconductor memory device can be formed.

In FIGS. 17, 18A, and 18B, over a base substrate 330 provided with an insulating layer 331, the select transistors S1 and S2 and the memory elements M0, M30, and M31 are provided. The select transistors S1 and S2 and the memory elements M0, M30, and M31 include gate electrode layers (SG2 and SG1) 327a and 327b; charge accumulation layers 323a, 323b, and 323c; control gate electrode layers (WL31, WL30, and WL0) 324a, 324b, and 324c; a first insulating layer 332; a second insulating layer 333; and an interlayer insulating layer 334. The select transistor S1 is connected to the bit line BL0 325, and the select transistor S2 is connected to a source line SL0 326.

The charge accumulation layers, the first insulating layer, the second insulating layer, the interlayer insulating layer, the control gate electrode layers, and the like can be formed by employing a material and a method similar to those in Embodiment Mode 5.

The SOI layer 322a which is included in the NAND-type cell 350a and the SOI layer 322b which is included in the NAND-type cell 350b are divided into island shapes and electrically isolated without forming an element isolation region.

As illustrated in FIGS. 18A and 18B, the insulating layer 331 in which a silicon nitride layer and a silicon oxide layer are sequentially stacked from the side of the base substrate 330 is provided over the base substrate 330, and the SOI layers 322a and 322b are provided over the insulating layer 331, with silicon oxide layer 321 interposed therebetween. Also as to the SOI layers 322a and 322b, with the use of the present invention, single crystal semiconductor regions are formed in the shapes of the SOI layers 322a and 322b over a bond wafer, and the island-shaped SOI layers 322a and 322b are transferred to the base substrate 330 and further processed into desired shapes over the base substrate. Groove processing is performed on the bond wafer, a plurality of the SOI layers are processed into desired shapes, and then the SOI layers are transferred to the base substrate, so that restriction on the shape or size of the bond wafer itself can be reduced and the SOI layers can be transferred to a large-sized substrate with high throughput. Further, a manufacturing process can be simplified because an element isolation region is not necessarily formed. The shapes of the SOI layers after being transferred are further processed, so that the shapes of the SOI layers can be controlled more precisely. Thus, since an SOI layer which is controlled accurately can be obtained, a yield is improved and reliability of a semiconductor device which is obtained is also improved. Therefore, a semiconductor element and an integrated circuit that have high performance can be manufactured with high productivity.

This embodiment mode can be implemented in combination with any of other embodiment modes described in this specification.

In this embodiment mode, when single crystal semiconductor layers are transferred from a bond wafer, a single crystal semiconductor substrate is etched selectively (this step is also referred to as groove processing), and a plurality of single crystal semiconductor layers divided such that they have the size of semiconductor elements to be manufactured are transferred to a different substrate (a base substrate). Thus, a plurality of island-shaped single crystal semiconductor layers (SOI layers) can be formed over the base substrate. Since the single crystal semiconductor layers which are processed into an element size in advance are transferred, transfer to the base substrate can be performed in units of the single crystal semiconductor layers; thus, the size and shape of the single crystal semiconductor substrate are not restricted. Therefore, transfer of single crystal semiconductor layers to a large-sized substrate can be performed more efficiently. Further, a manufacturing process can be simplified because an element isolation region does not have to be formed.

Further, in the present invention, etching is performed on the SOI layers formed over the base substrate, and the forms of the SOI layers are controlled precisely by processing and modifying. Accordingly, discrepancy in formation position and defects in shape of the SOI layer due to pattern misalignment caused by light exposure going around a resist mask, or the like during resist mask formation; position misalignment caused by a bonding step during transfer; or the like can be modified.

Thus, a plurality of single crystal semiconductor layers (SOI layers) having a desired shape can be formed over a base substrate with a high yield, according to this embodiment mode using the present invention. Accordingly, a semiconductor device, which includes a semiconductor element and an integrated circuit that have more precision and high performance, can be manufactured over a large-sized substrate with high throughput and high productivity.

Embodiment Mode 7

Figure 20:
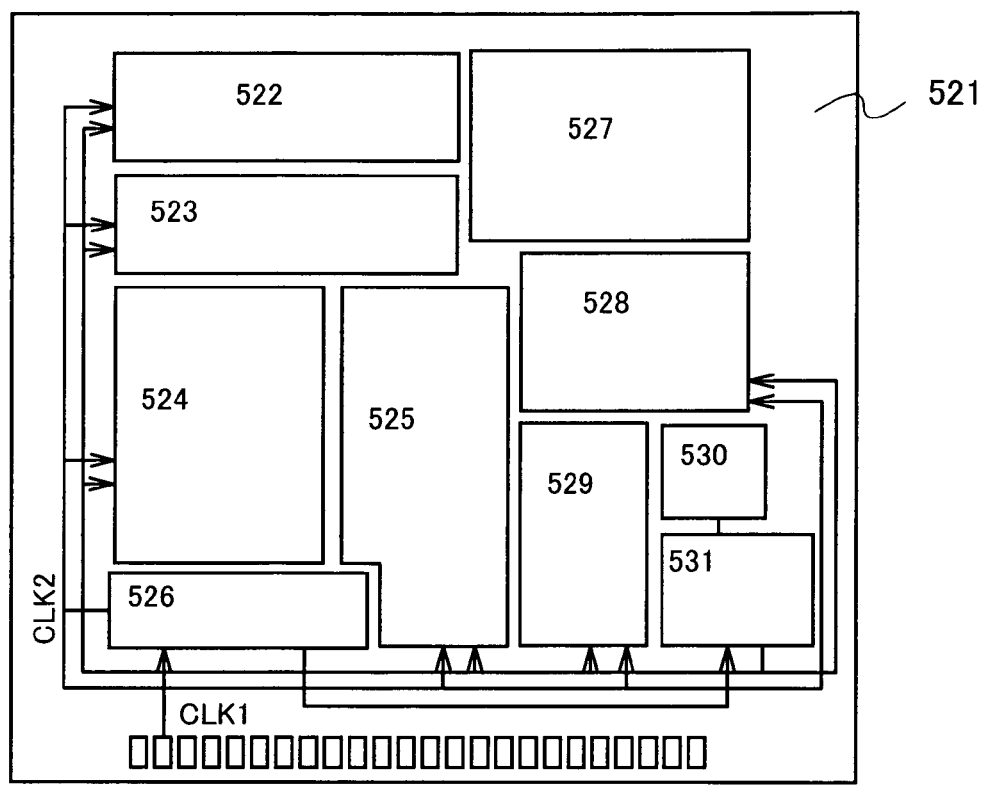
FIG. 20 is a block diagram illustrating a semiconductor device of the present invention.

This embodiment mode will describe a mode of a microprocessor as an example of a semiconductor device, which is manufactured in Embodiment Mode 3, with reference to FIG. 20.

FIG. 20 illustrates an example of a microprocessor 521.

The microprocessor 521 includes an arithmetic logic unit (also referred to as an ALU) 522, an ALU controller 523, an instruction decoder 524, an interrupt controller 525, a timing controller 526, a register 527, a register controller 528, a bus interface (Bus I/F) 529, a read only memory 530, and a ROM interface (ROM I/F) 531.

An instruction inputted to the microprocessor 521 via the bus interface 529 is inputted to the instruction decoder 524 and decoded therein, and then, inputted to the ALU controller 523, the interrupt controller 525, the register controller 528, and the timing controller 526. The ALU controller 523, the interrupt controller 525, the register controller 528, and the timing controller 526 perform respective controls based on the decoded instruction. Specifically, the ALU controller 523 generates signals to control operation of the ALU 522. While the microprocessor 521 is executing a program, the interrupt controller 525 determines an interrupt request from an external input/output device or a peripheral circuit based on its priority or a mask state, and processes the request. The register controller 528 generates an address of the register 527, and reads/writes data from/to the register 527 in accordance with the state of the microprocessor.

The timing controller 526 generates signals to control a drive timing of the ALU 522, the ALU controller 523, the instruction decoder 524, the interrupt controller 525, and the register controller 528. For example, the timing controller 526 is provided with an internal clock generator for generating an internal clock signal CLK2 based on a reference clock signal CLK1, and supplies the internal clock signal CLK2 to the above-described circuits. Note that the microprocessor 521 illustrated in FIG. 20 is just an example in which a configuration is simplified, and an actual microprocessor may have various configurations depending on the application.

This embodiment mode can be implemented in combination with any of other embodiment modes described in this specification.

In this embodiment mode, when single crystal semiconductor layers are transferred from a bond wafer, a single crystal semiconductor substrate is etched selectively (this step is also referred to as groove processing), and a plurality of single crystal semiconductor layers divided such that they have the size of semiconductor elements to be manufactured are transferred to a different substrate (a base substrate). Thus, a plurality of island-shaped single crystal semiconductor layers (SOI layers) can be formed over the base substrate. Since the single crystal semiconductor layers which are processed into an element size in advance are transferred, transfer to the base substrate can be performed in units of the single crystal semiconductor layers; thus, the size and shape of the single crystal semiconductor substrate are not restricted. Therefore, transfer of single crystal semiconductor layers to a large-sized substrate can be performed more efficiently. Further, a manufacturing process can be simplified because an element isolation region does not have to be formed.

Further, in the present invention, etching is performed on the SOI layers formed over the base substrate, and the forms of the SOI layers are controlled precisely by processing and modifying. Accordingly, discrepancy in formation position and defects in shape of the SOI layer due to pattern misalignment caused by light exposure going around a resist mask, or the like during resist mask formation; position misalignment caused by a bonding step during transfer; or the like can be modified.

Thus, a plurality of single crystal semiconductor layers (SOI layers) having a desired shape can be formed over a base substrate with a high yield, according to this embodiment mode using the present invention. Accordingly, a semiconductor device, which includes a semiconductor element and an integrated circuit that have more precision and high performance, can be manufactured over a large-sized substrate with high throughput and high productivity.

Embodiment Mode 8

Figure 21:
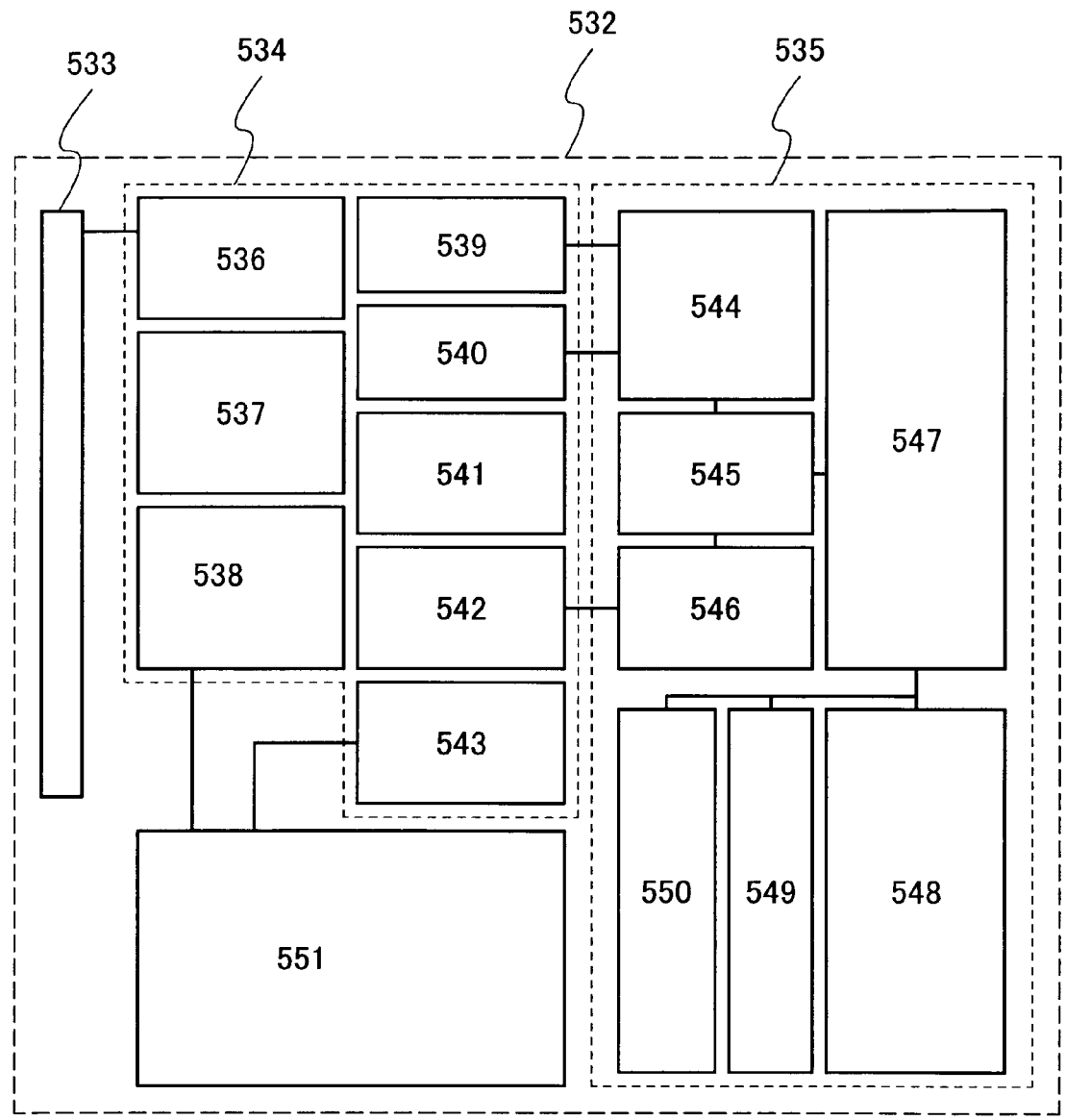
FIG. 21 is a block diagram illustrating a semiconductor device of the present invention.

This embodiment mode will describe a mode of a microcomputer, which includes a communication circuit and can input and output data without contact, as an example of a semiconductor device, which is manufactured in Embodiment Mode 3, with reference to FIG. 21.

FIG. 21 illustrates a block diagram of a microcomputer 532 relating to this embodiment mode. This microcomputer 532 includes an antenna circuit 533, an analog circuit portion 534, and a digital circuit portion 535. The analog circuit portion 534 has a resonant circuit 536 having a resonant capacitor, a constant voltage circuit 537, a rectifier circuit 538, a demodulation circuit 539, a modulation circuit 540, a reset circuit 541, an oscillation circuit 542, and a power supply control circuit 543. The digital circuit portion 535 includes an RF interface 544, a control register 545, a clock controller 546, an interface 547, a central processing unit 548, a random access memory 549, and a read only memory 550. In addition, as power needed to operate the microcomputer 532, power, a wireless signal of which is received at the antenna circuit 533 and rectified through the rectifier circuit 538, is charged to a power storage portion 551. The power storage portion 551 includes a capacitor such as a ceramic capacitor or an electric double layer capacitor. The power storage portion 551 is not necessarily integrated with the microcomputer 532 and may be bonded to a substrate having an insulating surface that partially constitutes the microcomputer 532 as another component.

The operation of the microcomputer 532 having such a structure is exemplary described below. A signal received at the antenna circuit 533 causes induced electromotive force at the resonant circuit 536. The inputted signal is demodulated at the demodulation circuit 539, and a control instruction and a data signal are outputted to the digital circuit portion 535. The reset circuit 541 generates a signal that resets and initializes the digital circuit portion 535. For example, the reset signal 541 generates, as a reset signal, a signal that rises with delay after increase in the power supply voltage. The oscillation circuit 542 changes the frequency and the duty ratio of a clock signal in accordance with a control signal generated at the constant voltage circuit 537. The demodulation circuit 539 having a low pass filter binarizes changes in amplitude of reception signals of an amplitude shift keying (ASK) system, for example. The modulation circuit 540 transmits transmission data by changing the amplitude of transmission signals of an amplitude shift keying (ASK) system. The modulation circuit 540 changes the resonance point of the resonance circuit 536, thereby changing the amplitude of communication signals. The clock controller 546 generates a control signal for changing the frequency and the duty ratio of the clock signal in accordance with the power supply voltage or current consumption in the central processing unit 548. The power supply voltage is monitored by the power supply control circuit 543.

A signal that is inputted to the microcomputer 532 from the antenna circuit 533 is demodulated at the demodulation circuit 539, and then divided into a control command, data, and the like by the RF interface 544. The control command is stored in the control register 545. The control command includes reading of data stored in the read only memory 550, writing of data to the random access memory 549, an arithmetic instruction to the central processing unit 548, and the like. The central processing unit 548 accesses the read only memory 550, the random access memory 549, and the control register 545 via the interface 547. The interface 547 has a function of generating an access signal for any one of the read only memory 550, the random access memory 549, or the control register 545 based on an address requested by the central processing unit 548.

As an arithmetic method of the central processing unit 548, a method can be employed in which the read only memory 550 stores an OS (operating system) and a reading program is executed at the time of starting operation. Alternatively, a method can be employed in which a circuit dedicated to arithmetic is formed and an arithmetic process is conducted using hardware. In a method in which both hardware and software are used, a method can be used in which part of process is conducted in the circuit dedicated to arithmetic and the other part of the arithmetic process is conducted by the central processing unit 548 using a program.

Figure 22:
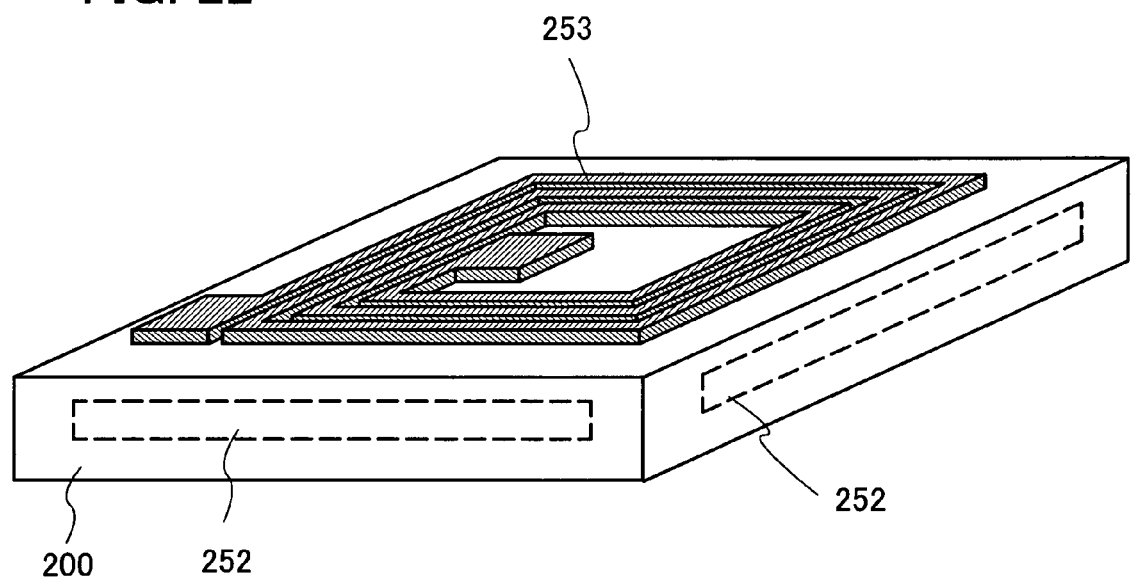
FIG. 22 is a perspective view illustrating a semiconductor device of the present invention.

FIG. 22 illustrates an appearance of a microcomputer relating to this embodiment mode having such a structure as described above. A plurality of SOI layers are provided over the base substrate 200, whereby an element formation layer 252, where an n-type MISFET and a p-type MISFET are formed, is formed. The element formation layer 252 forms the analog circuit portion 534 and the digital circuit portion 535 in FIG. 21. An antenna 253 is provided over the base substrate 200. Alternatively, an antenna connection terminal may be provided instead of this antenna 253. The antenna 253 illustrated in FIG. 22 is a magnetic field type spiral antenna, which may be combined with a dipole antenna and the like which is an electric field type antenna.

Figure 25:
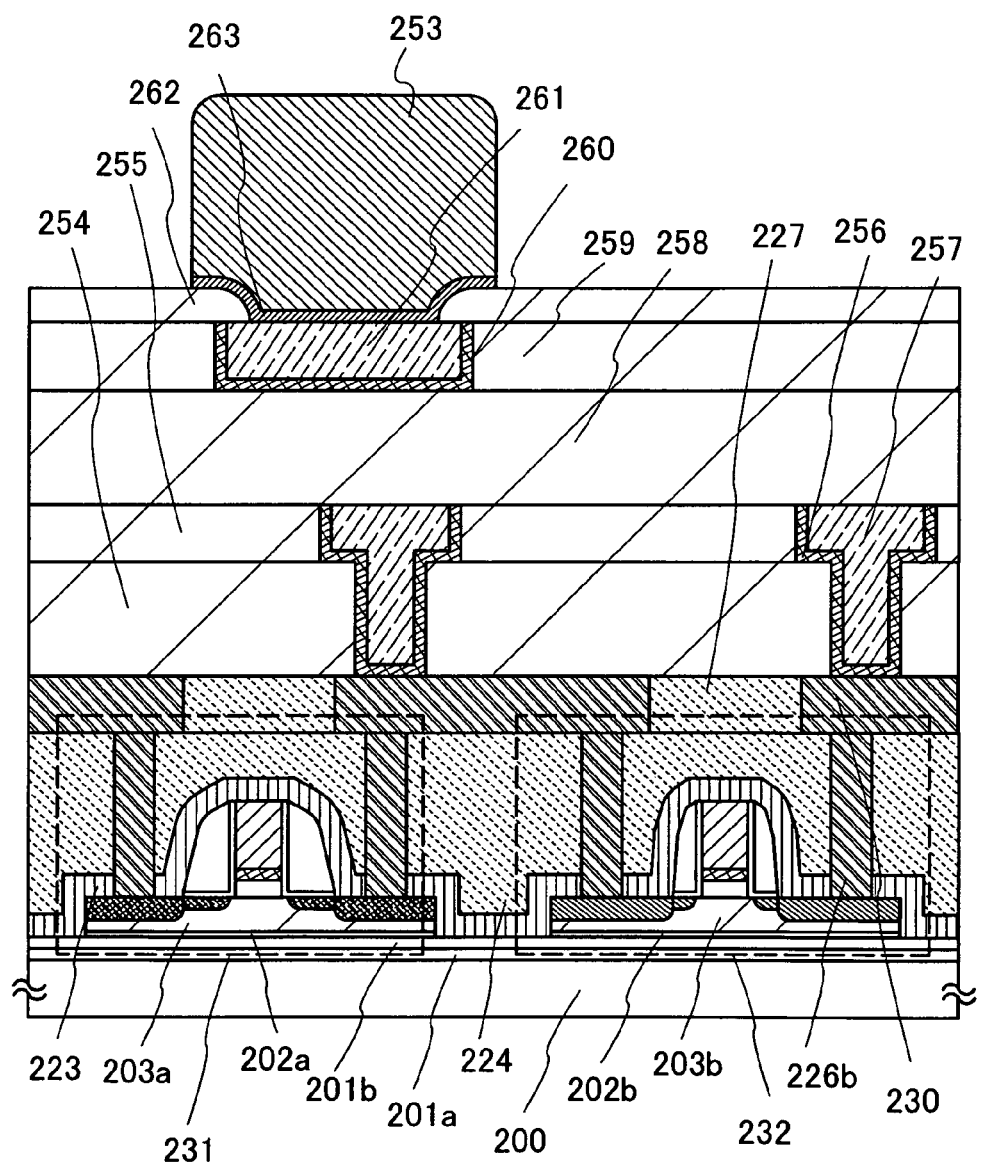
FIG. 25 is a cross-sectional view illustrating a semiconductor device of the present invention.

FIG. 25 illustrates a main part of the microcomputer illustrated in FIG. 22, and a cross-sectional structure of which is schematically illustrated. An n-type MISFET and a p-type MISFET are formed by SOI layers 203a and 203b over the base substrate 200. The structure of layers lower than a second interlayer insulating layer 227 is similar to that of FIGS. 12A and 12B; thus, description thereof is omitted.

A third interlayer insulating layer 254 and a fourth interlayer insulating layer 255 are formed over a third wiring layer 230. The third interlayer insulating layer 254 is formed of a silicon oxide film, and the fourth interlayer insulating layer 255 is formed of a silicon nitride film. Openings each having a different groove width are formed by dual damascene. A barrier metal 256 such as tantalum nitride is formed in each opening, and a copper wiring 257 is formed by copper plating. Further, a fifth interlayer insulating layer 258 and a sixth interlayer insulating layer 259 are formed, and a barrier metal 260 and a copper wiring 261, which is formed by copper plating, are provided. An antenna 253 is provided over a seventh interlayer insulating layer 262. A seed layer 263 is formed when the antenna 253 is formed by a copper plating method. As the antenna 253, conductive films such as aluminum may be deposited by sputtering and processed into an antenna shape by a photolithography method.

Productivity of such a microcomputer can be improved with the use of a large-sized glass substrate as the base substrate 200. For example, a fourth-generation liquid crystal panel which is distributed to the market has a size of 730 mm×920 mm and the area of 671600 mm². In the case of cutting out 2 mm square chips, 340 thousand chips can be obtained by estimate even if a margin of a chip is ignored. Approximately 670 thousand chips in the case of 1 mm square chips and 4 million chips in the case of 0.4 mm square chips can be obtained. A glass substrate has a thickness of 0.4 to 0.7 mm. The thickness can also be reduced up to approximately 0.1 to 0.3 mm when a protective film is bonded to a face opposite to a face to which the SOI layers are fixed.

In this embodiment mode, when single crystal semiconductor layers are transferred from a bond wafer, a single crystal semiconductor substrate is etched selectively (this step is also referred to as groove processing), and a plurality of single crystal semiconductor layers divided such that they have the size of semiconductor elements to be manufactured are transferred to a different substrate (a base substrate). Thus, a plurality of island-shaped single crystal semiconductor layers (SOI layers) can be formed over the base substrate. Since the single crystal semiconductor layers which are processed into an element size in advance are transferred, transfer to the base substrate can be performed in units of the single crystal semiconductor layers; thus, the size and shape of the single crystal semiconductor substrate are not restricted. Therefore, transfer of single crystal semiconductor layers to a large-sized substrate can be performed more efficiently. Further, a manufacturing process can be simplified because an element isolation region does not have to be formed.

Further, in the present invention, etching is performed on the SOI layers formed over the base substrate, and the forms of the SOI layers are controlled precisely by processing and modifying the SOI layers. Accordingly, discrepancy in formation position and defects in shape of the SOI layer due to pattern misalignment caused by light exposure going around a resist mask, or the like during resist mask formation; position misalignment caused by a bonding step during transfer; or the like can be modified.

Thus, a plurality of single crystal semiconductor layers (SOI layers) having a desired shape can be formed over a base substrate with a high yield, according to this embodiment mode using the present invention. Accordingly, a semiconductor device, which includes a semiconductor element and an integrated circuit that have more precision and high performance, can be manufactured over a large-sized substrate with high throughput and high productivity.

Embodiment Mode 9

A semiconductor device of the present invention, which has a very wide range of application, can be used in electronic devices in all kinds of fields.

Further, a memory device or the like, which is a semiconductor device formed using the present invention, can be used in electronic devices which include a memory in all kinds of fields. For example, an electronic device to which the nonvolatile semiconductor memory device of Embodiment Modes 3 to 5 and the like is applied may be a camera such as a video camera or a digital camera, a goggle-type display (head-mounted display), a navigation system, an audio reproducing device (a car audio, an audio component, or the like), a computer, a game machine, a portable information terminal (a mobile computer, a cellular phone, a portable game machine, an electronic book, or the like), an image reproducing device which includes a recording medium (specifically, a device for reproducing a recording medium such as a digital versatile disc (DVD), and having a display which can display the images), or the like. Specific examples of these electronic devices are illustrated in FIGS. 24A to 24E.

Figure 24A:
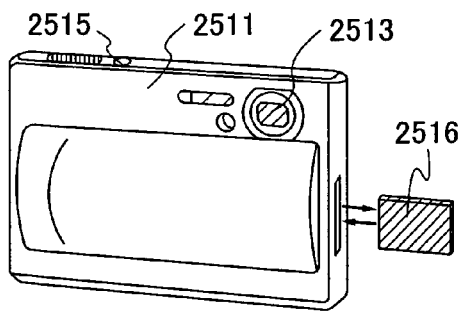
FIGS. 24A to 24E are views each illustrating an electronic device to which the present invention is applied.
Figure 24B:
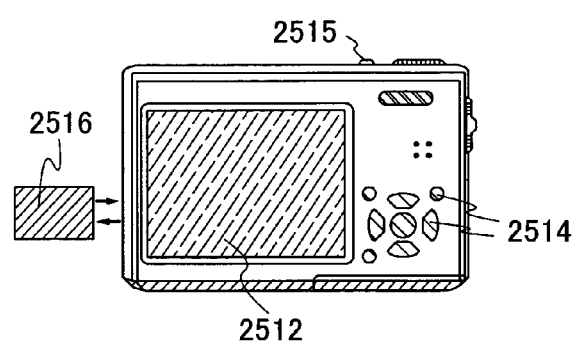

FIGS. 24A and 24B illustrate a digital camera. FIG. 24B is a view of the back side of FIG. 24A. This digital camera includes a housing 2511, a display portion 2512, a lens 2513, operation keys 2514, a shutter release button 2515, and the like. Further, the digital camera includes a removable memory 2516, in which data photographed using the digital camera is stored. A nonvolatile semiconductor memory device, which is a semiconductor device formed using the present invention, or the like can be applied to the memory 2516.

Figure 24C:
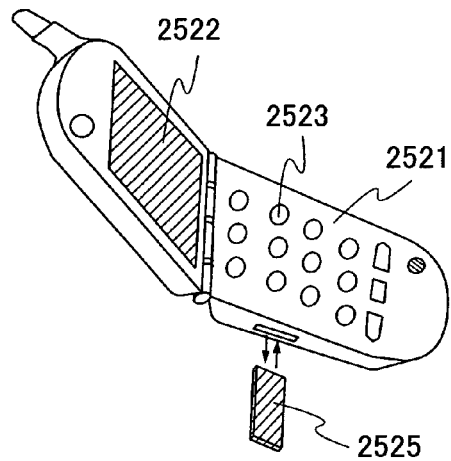

FIG. 24C illustrates a cellular phone, which is a typical example of a portable terminal. The cellular phone includes a housing 2521, a display portion 2522, operation keys 2523, and the like. Further, the cellular phone includes a removable memory 2525. Data such as the telephone number of the cellular phone, images, music data, and the like can be stored in the memory 2525 and reproduced. A nonvolatile semiconductor memory device, which is a semiconductor device formed using the present invention, or the like can be applied to the memory 2525.

Figure 24D:
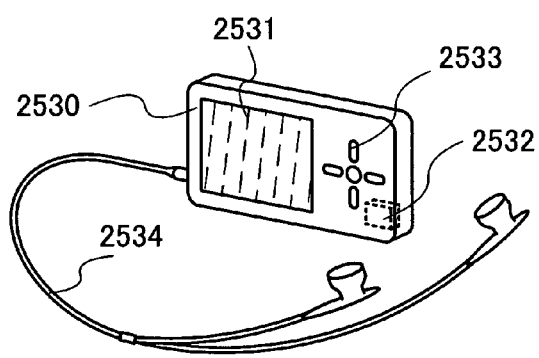

Further, FIG. 24D illustrates a digital player, which is a typical example of an audio device. The digital player illustrated in FIG. 24D includes a main body 2530, a display portion 2531, a memory 2532, an operation portion 2533, earphones 2534, and the like. Note that headphones or wireless earphones can be used instead of the earphones 2534. A nonvolatile semiconductor memory device, which is a semiconductor device formed using the present invention, or the like can be used for the memory 2532. For example, when a NAND-type nonvolatile memory with a memory capacity of 20 to 200 gigabytes (GB) is used and the operation portion 2533 is operated, images and sound (e.g., music) can be stored and reproduced. Note that when white characters are displayed on a black background in the display portion 2531, power consumption can be suppressed. This is particularly effective in a portable audio device. Note that a nonvolatile semiconductor memory device which is provided in the memory 2532 may be removable.

Figure 24E:
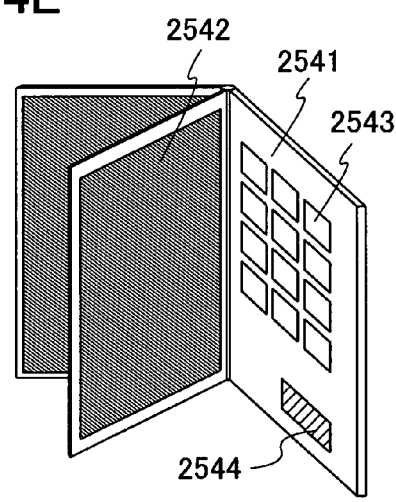

Further, FIG. 24E illustrates an electronic book (also referred to as electronic paper). This electronic book includes a main body 2541, a display portion 2542, operation keys 2543, and a memory 2544. A modem may be built into the main body 2541, or a structure in which information can be transmitted and received wirelessly may be employed. A nonvolatile semiconductor memory device, which is a semiconductor device formed using the present invention, or the like can be used for the memory 2544. For example, when a NAND-type nonvolatile memory with a memory capacity of 20 to 200 gigabytes (GB) is used and the operation keys 2543 are operated, images and sound (e.g. music) can be stored and reproduced. Note that a nonvolatile semiconductor memory device which is provided in the memory 2544 may be removable.

As set forth above, a semiconductor device of the present invention can be used in electronic devices in all kinds of fields.

Embodiment Mode 10

According to the present invention, a semiconductor device, which function as a chip including a processor circuit (hereinafter also referred to as a processor chip, a wireless chip, a wireless processor, a wireless memory, or a wireless tag) can be formed. An applicable range of the semiconductor device of the present invention is wide, and the semiconductor device can be applied to any product as long as it is a product whose production, management, or the like can be supported by clarification of information such as the history of an object without contact. For example, the semiconductor device can be mounted on paper money, coins, securities, certificates, bearer bonds, packing containers, books, recording media, personal belongings, vehicles, food, clothing, health products, commodities, medicine, electronic devices, or the like. Examples thereof will be explained with reference to FIGS. 23A to 23G.

Figure 23A:
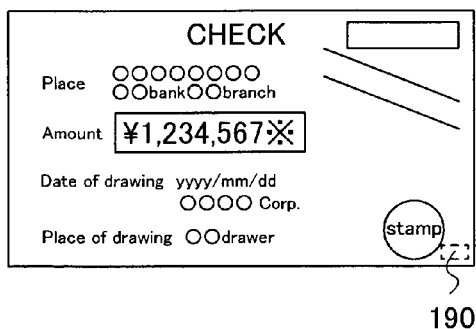
FIGS. 23A to 23G are views each illustrating an application example of a semiconductor device of the present invention.
Figure 23B:
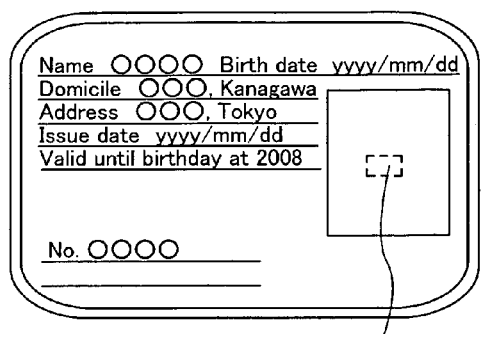
Figure 23C:
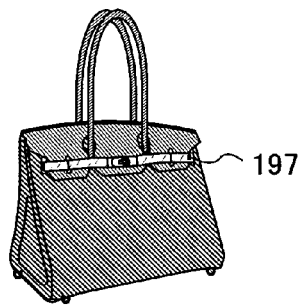
Figure 23D:
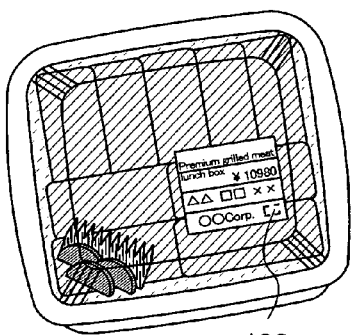
Figure 23E:
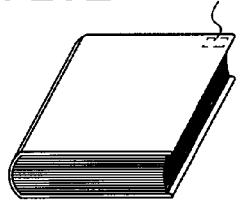
Figure 23F:
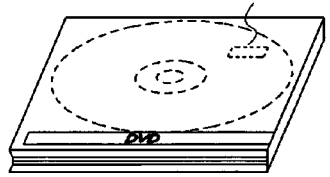
Figure 23G:
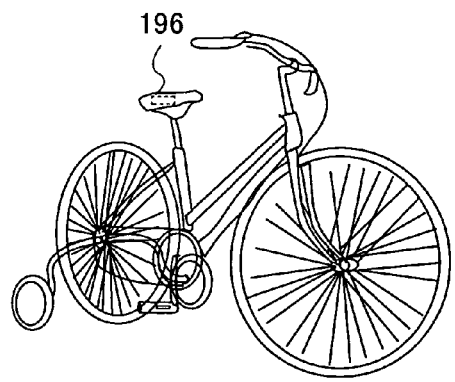

The paper money and coins are money distributed to the market, and include one valid in a certain area (cash voucher), memorial coins, and the like. The securities refer to checks, certificates, promissory notes, and the like, and can be provided with a chip 190 including a processor circuit (FIG. 23A). The certificates refer to driver's licenses, certificates of residence, and the like, and can be provided with a chip 191 including a processor circuit (FIG. 23B). The personal belongings refer to bags, glasses, and the like, and can be provided with a chip 197 including a processor circuit (FIG. 23C). The bearer bonds refer to stamps, rice coupons, various gift certificates, and the like. The packing containers refer to wrapping paper for food containers and the like, plastic bottles, and the like, and can be provided with a chip 193 including a processor circuit (FIG. 23D). The books refer to hardbacks, paperbacks, and the like, and can be provided with a chip 194 including a processor circuit (FIG. 23E). The recording media refer to DVD software, video tapes, and the like (FIG. 23F). The vehicles refer to wheeled vehicles such as bicycles, ships, and the like, and can be provided with a chip 196 including a processor circuit (FIG. 23G). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (television receivers and flat-screen television receivers), cellular phones, and the like.

The semiconductor device can be provided by being bonded to the surface of an article or being embedded in an article. For example, in the case of a book, the semiconductor device may be embedded in a piece of paper; in the case of a package made from an organic resin, the semiconductor device may be embedded in the organic resin.

In this manner, the efficiency of an inspection system, a system used in a rental shop, or the like can be improved by providing the semiconductor device to the packing containers, the recording media, the personal belonging, the food, the clothing, the commodities, the electronic devices, or the like. In addition, by providing the semiconductor device to the vehicles, forgery or theft can be prevented. Further, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

This embodiment mode can be carried out by being freely combined with any of Embodiment Modes 1 to 9

The present application is based on Japanese Patent Application serial no. 2007-079787 filed with Japan Patent Office on Mar. 26, in 2007, the entire contents of which are hereby incorporated by reference.

What is claimed is:

1. A method for manufacturing a semiconductor device comprising:
    selectively etching a single crystal semiconductor substrate to form a groove in the single crystal semiconductor substrate;
    irradiating the single crystal semiconductor substrate with at least one of hydrogen and rare gas ions to form a plurality of separation layers formed at a certain depth from a surface of the single crystal semiconductor substrate, thereby, forming a plurality of first single crystal semiconductor layers over the plurality of separation layers;
    bonding a substrate having an insulating surface and the single crystal semiconductor substrate with each other;
    separating the plurality of first single crystal semiconductor layers from the single crystal semiconductor substrate so as to leave the plurality of first single crystal semiconductor layers over the insulating surface of the substrate; and
    selectively etching the plurality of first single crystal semiconductor layers to form a plurality of second single crystal semiconductor layers.

2. The method for manufacturing a semiconductor device according to claim 1, wherein the plurality of second single crystal semiconductor layers has a plurality of sizes.

3. The method for manufacturing a semiconductor device according to claim 1, wherein the plurality of first single crystal semiconductor layers is separated from a plurality of the single crystal semiconductor substrates so as to leave the plurality of first single crystal semiconductor layers over the insulating surface of the substrate.

4. The method for manufacturing a semiconductor device according to claim 1, wherein a plurality of semiconductor elements are formed using the plurality of second single crystal semiconductor layers.

5. The method for manufacturing a semiconductor device according to claim 1, wherein a plurality of transistors and memory elements are formed using the plurality of second single crystal semiconductor layers.

6. The method for manufacturing a semiconductor device according to claim 1, wherein the separating step is conducted by a heat treatment.

7. The method for manufacturing a semiconductor device according to claim 1, wherein the semiconductor device is one selected from the group consisting of a chip, a removable memory, a camera, a phone, a digital player, and an electronic book.

8. A method for manufacturing a semiconductor device comprising:
    forming a silicon oxide film and a silicon nitride film over a single crystal semiconductor substrate;
    selectively etching the silicon oxide film and the silicon nitride film to form a silicon oxide layer and a silicon nitride layer;
    selectively etching the single crystal semiconductor substrate using the silicon nitride layer as a mask to form a groove in the single crystal semiconductor substrate;
    irradiating the single crystal semiconductor substrate with at least one of hydrogen and rare gas ions to form a plurality of separation layers formed at a certain depth from a surface of the single semiconductor substrate, thereby, forming each of a plurality of first single crystal semiconductor layers over each of the plurality of separation layers;
    bonding a substrate having an insulating surface and the single crystal semiconductor substrate with each other;
    separating the plurality of first single crystal semiconductor layers from the single crystal semiconductor substrate so as to leave the plurality of first single crystal semiconductor layers over the insulating surface of the substrate; and
    selectively etching the plurality of first single crystal semiconductor layers to form a plurality of second single crystal semiconductor layers.

9. The method for manufacturing a semiconductor device according to claim 8, wherein the plurality of second single crystal semiconductor layers has a plurality of sizes.

10. The method for manufacturing a semiconductor device according to claim 8, wherein the plurality of first single crystal semiconductor layers is separated from a plurality of the single crystal semiconductor substrates so as to leave the plurality of first single crystal semiconductor layers over the insulating surface of the substrate.

11. The method for manufacturing a semiconductor device according to claim 8, wherein a plurality of semiconductor elements are formed using the plurality of second single crystal semiconductor layers.

12. The method for manufacturing a semiconductor device according to claim 8, wherein a plurality of transistors and memory elements are formed using the plurality of second single crystal semiconductor layers.

13. The method for manufacturing a semiconductor device according to claim 8, wherein the separating step is conducted by a heat treatment.

14. The method for manufacturing a semiconductor device according to claim 8, wherein the semiconductor device is one selected from the group consisting of a chip, a removable memory, a camera, a phone, a digital player, and an electronic book.

15. A method for manufacturing a semiconductor device comprising:
- selectively etching a portion of a single crystal semiconductor bond wafer at a certain depth;
- thereafter irradiating the single crystal semiconductor bond wafer with ions including at least one of hydrogen and rare gas to form a separation layer in the single crystal semiconductor bond wafer;
- bonding a base substrate having an insulating surface and the single crystal semiconductor bond wafer with each other;
- separating at least one single crystal semiconductor layer from the single crystal semiconductor bond wafer so as to leave the single crystal semiconductor layer over the insulating surface of the base substrate; and
- selectively etching the single crystal semiconductor layer to form a plurality of single crystal semiconductor layers.

16. The method for manufacturing a semiconductor device according to claim 15, wherein irradiating with ions is conducted by ion doping method.

17. The method for manufacturing a semiconductor device according to claim 15, wherein the separating step is conducted by a heat treatment.

18. The method for manufacturing a semiconductor device according to claim 15, wherein the base substrate is one selected from the group consisting of glass, quartz and sapphire.

19. A method for manufacturing a semiconductor device comprising:
- selectively etching a portion of a single crystal semiconductor bond wafer at a certain depth;
- thereafter forming a separation layer in the single crystal semiconductor bond wafer by irradiating the single crystal semiconductor bond wafer with ions including at least one of hydrogen and rare gas element
- bonding a base substrate having an insulating surface and the single crystal semiconductor bond wafer with each other;
- separating at least one single crystal semiconductor layer from the single crystal semiconductor bond wafer so as to leave the single crystal semiconductor layer over the insulating surface of the base substrate; and
- selectively etching the single crystal semiconductor layer to form a plurality of single crystal semiconductor layers.

20. The method for manufacturing a semiconductor device according to claim 19, wherein irradiating with ions is conducted by ion doping method.

21. The method for manufacturing a semiconductor device according to claim 19, wherein the separating step is conducted by a heat treatment.

22. The method for manufacturing a semiconductor device according to claim 19, wherein the base substrate is one selected from the group consisting of glass, quartz and sapphire.

23. A method for manufacturing a semiconductor device comprising:
- forming a separation layer in a single crystal semiconductor bond wafer having a selectively etched portion by irradiating the etched single crystal semiconductor bond wafer with ions including at least one of hydrogen and rare gas element
- bonding a base substrate having an insulating surface and the single crystal semiconductor bond wafer with each other;
- separating at least one single crystal semiconductor layer from the single crystal semiconductor bond wafer so as to leave the single crystal semiconductor layer over the insulating surface of the base substrate; and
- selectively etching the single crystal semiconductor layer to form a plurality of single crystal semiconductor layers.

24. The method for manufacturing a semiconductor device according to claim 23, wherein irradiating with ions is conducted by ion doping method.

25. The method for manufacturing a semiconductor device according to claim 23, wherein the separating step is conducted by a heat treatment.

26. The method for manufacturing a semiconductor device according to claim 23, wherein the base substrate is one selected from the group consisting of glass, quartz and sapphire.

* * * * *